United States Patent
Ren et al.

(10) Patent No.: US 9,384,936 B2
(45) Date of Patent: Jul. 5, 2016

(54) ENERGY FILTER FOR CHARGED PARTICLE BEAM APPARATUS

(71) Applicant: Hermes Microvision Inc., Hsinchu (TW)

(72) Inventors: Weiming Ren, San Jose, CA (US); Joe Wang, Campbell, CA (US); Shuai Li, Beijing (CN); Zhongwei Chen, San Jose, CA (US)

(73) Assignee: Hermes Microvision Inc., Hsinchu (TW)

( * ) Notice: Subject to any disclaimer, the term of this patent is extended or adjusted under 35 U.S.C. 154(b) by 0 days.

(21) Appl. No.: 14/800,098

(22) Filed: Jul. 15, 2015

(65) Prior Publication Data

US 2016/0035533 A1 Feb. 4, 2016

Related U.S. Application Data

(60) Continuation-in-part of application No. 14/608,828, filed on Jan. 29, 2015, now Pat. No. 9,117,626, which is a division of application No. 14/276,000, filed on May 13, 2014, now Pat. No. 9,000,395.

(60) Provisional application No. 61/823,042, filed on May 14, 2013, provisional application No. 61/804,794, filed on Mar. 25, 2013.

(51) Int. Cl.
*G01T 1/20* (2006.01)
*H01J 37/05* (2006.01)
(Continued)

(52) U.S. Cl.
CPC .................. *H01J 37/05* (2013.01); *H01J 37/10* (2013.01); *H01J 37/12* (2013.01); *H01J 37/244* (2013.01); *H01J 37/28* (2013.01); *H01J 37/263* (2013.01); *H01J 2237/057* (2013.01); *H01J 2237/12* (2013.01); *H01J 2237/14* (2013.01)

(58) Field of Classification Search
CPC ........... H01J 37/10; H01J 37/12; H01J 37/14; H01J 37/141; H01J 37/1413; H01J 37/143; H01J 37/145; H01J 37/147; H01J 37/1471; H01J 37/1472; H01J 37/00; H01J 37/02
USPC .............. 250/305, 396 R, 397, 398, 399, 400
See application file for complete search history.

(56) References Cited

U.S. PATENT DOCUMENTS 5,541,409 A 7/1996 Enloe
6,501,076 B1 * 12/2002 Kelly ................... G01N 23/227
250/281

(Continued)

OTHER PUBLICATIONS

Joseph Ladislas Wiza, "Microchannel Plate Detectors", Nuclear Instruments and Methods, vol. 162, 1979, pp. 587-601.

*Primary Examiner* — Nicole Ippolito
*Assistant Examiner* — Jason McCormack
(74) *Attorney, Agent, or Firm* — WPAT, PC; Justin King

(57) ABSTRACT

This invention provides two methods for improving performance of an energy-discrimination detection device with an energy filter of reflective type for a charged particle beam. The first method employs a beam-adjusting means to improve the energy-discrimination power, and the second method uses an electron-multiplication means to enhance the image signal without noise raise. A LVSEM with such an improved energy-discrimination detection device can provide variant high-contrast images of interested features on a specimen surface for multiple application purposes.

20 Claims, 15 Drawing Sheets

(51) Int. Cl.
*H01J 37/10* (2006.01)
*H01J 37/28* (2006.01)
*H01J 37/12* (2006.01)
*H01J 37/244* (2006.01)
*H01J 37/26* (2006.01)

(56) References Cited

U.S. PATENT DOCUMENTS

| | | |
|---|---|---|
| 7,141,791 B2 | 11/2006 | Masnaghetti et al. |
| 7,276,694 B1 * | 10/2007 | Bertsche ............... H01J 37/244 250/305 |
| 7,335,894 B2 | 2/2008 | Frosien et al. |
| 7,544,937 B2 | 6/2009 | Frosien |
| 7,683,317 B2 | 3/2010 | Shemesh |
| 7,714,287 B1 | 5/2010 | James et al. |
| 8,203,119 B2 | 6/2012 | Degenhardt et al. |
| 9,000,395 B2 * | 4/2015 | Ren ....................... H01J 37/05 250/310 |
| 9,117,626 B1 * | 8/2015 | Ren ....................... H01J 37/05 250/310 |
| 2006/0226360 A1 * | 10/2006 | Frosien ................. H01J 37/05 250/310 |
| 2014/0299767 A1 | 10/2014 | Bizen et al. |

* cited by examiner

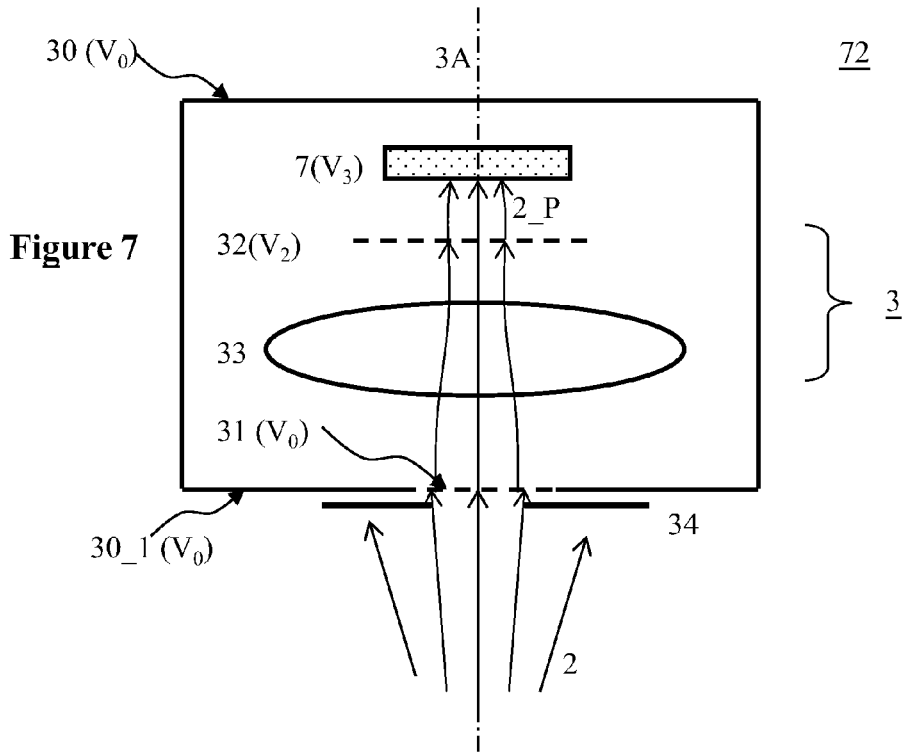
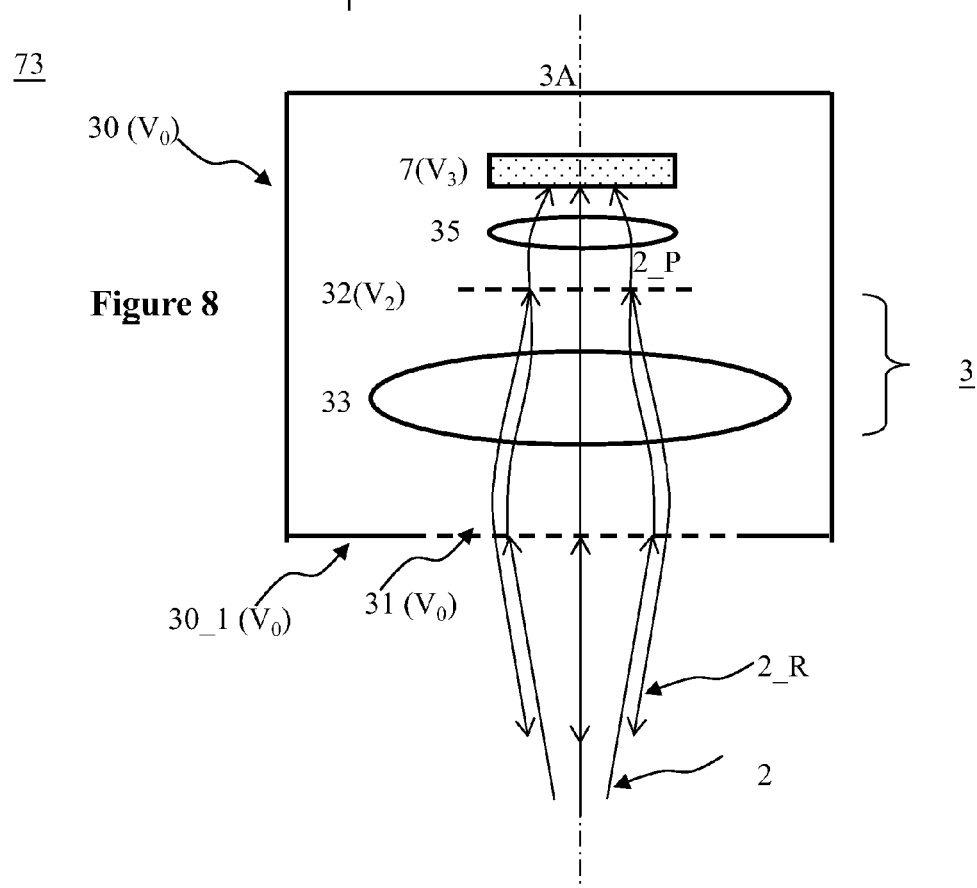

ENERGY FILTER FOR CHARGED PARTICLE BEAM APPARATUS

CLAIM OF PRIORITY

This application is a continuation-in-part of U.S. utility application Ser. No. 14/608,828 filed Jan. 29, 2015 and entitled "An energy-discrimination detection device", which claims the benefit of priority of U.S. utility application Ser. No. 14/276,000 filed on May 13, 2014, which claims the priorities of U.S. provisional applications No. 61/823,042 and No. 61/804,794, the entire disclosures of which are incorporated herein by reference.

FIELD OF THE INVENTION

The invention relates to a charged particle beam device, and more particularly to an energy filter for filtering a charged particle beam in terms of particle energies thereof. The invention also relates to a charged beam apparatus suitable for using such a device, such as an energy-discrimination detection device in a low-voltage scanning electron microscope (LVSEM) for inspecting defects on surfaces of wafers or masks in semiconductor manufacturing industry. However, it would be recognized that the invention has a much broader range of applicability.

BACKGROUND OF THE INVENTION

In the field of LVSEM and the related industrial fields which employ the principle of LVSEM to observe features on a specimen surface, such as defect review and defect inspection of wafers or masks for yield management in semiconductor manufacture, forming an image of a specimen surface with high contrast and high resolution for the interested features has been demanded and pursued.

In a LVSEM, a primary electron (PE) beam is generated by an electron source, and then focused onto and forced to scan the examined specimen surface by electron optics. The electron optics generally comprises a condenser lens, an objective lens and a deflector. The PE beam interacts with the specimen and make the specimen release a secondary emission beam therefrom. The secondary emission beam comprises secondary electrons (energy≤50 eV) and backscattered electrons (50 eV<energy≤PE energy). To limit both the radiation damage on the specimen and the PE beam/specimen interaction to a very small volume beneath the specimen surface, the PE beam is designed to land on the specimen with low energy (<5 keV). In this case, the secondary electrons (SEs) and backscattered electrons (BSEs) are mainly related to the features on the specimen surface where the PE beam lands on, thereby becoming appropriate signal electrons for forming images of the specimen surface. The SEs and/or BSEs are detected by detectors to obtain images of the examined specimen surface.

The contrast of the image in the LVSEM can be generated by many factors and mainly depends on the detection of the signal electrons (SEs and BSEs). The yield δ of the secondary electron (SE) emission (ratio of the number of SEs and the number of primary electrons) changes with the incidence angle (relative to the specimen surface normal) of the PE beam and not sensitive to atomic numbers of the materials of the specimen surface, and therefore an SE image (obtained by detecting SEs) can show the topography of the specimen surface due to geometric inclination differences (topography contrast). The coefficient η of the backscattered electron (BSE) emission (ratio of the number of BSEs and the number of primary electrons) changes with atomic numbers of the materials of the specimen surface and less sensitive to the local inclinations on the specimen surface, and consequently a BSE image (obtained by detecting BSEs) can show material differences (material contrast) of the specimen surface. Furthermore, a Low-Loss (LL) BSE image (obtained by detecting BSEs with energy loss of around 100 eV or less) can exhibit a good contrast for nano-material composition with subtle compositional variation. Besides, an SE image can show potential differences (voltage contrast) on the specimen surface because SE yield δ also changes with PE energy and SEs are too slow to sustain the influence of the additional electric field generated by the potential differences.

Although the resolution of an image in the LVSEM is fundamentally determined by the aberrations of the electron optics thereof, many factors can deteriorate it. An amount of net electrical charges appears on the specimen surface if the total yield σ (=δ+η) of the secondary emission is not equal to 1. As an SE image is easily influenced by the net electrical charges, BSE images have become very important for high resolution investigation of critical or charging specimens.

In the LVSEM, both SEs and BSEs travel in substantially same directions. Therefore the signal electrons collected by an electron detector will be the combination of SEs and BSEs, and the image may comprise topography contrast, material contrast and voltage contrast due to conventional electron detectors have very low sensitivities to the energies of the detected signal electrons. To clearly show some interested features, the image in an application may be required to comprise only one kind of the contrasts. Accordingly, the detection of the signal electrons (SEs and BSEs) is better sensitive to the energies thereof; i.e. it is desired to use an energy-discrimination detection which can selectively detect signal electrons in terms of energies thereof. Typically, the energy-discrimination detection is realized by making the signal electrons pass through an energy filter before being collected by a conventional detector.

The intensity distributions of SEs and BSEs in the beam of secondary emission depend on initial kinetic energies and emission angles thereof, and therefore the filtering function of the energy filter is preferred to be energy-depending other than energy-angle-depending. The energy-depending filtering is only sensitive to electron energies, and the energy-angle-depending filtering is sensitive to electron emission angles as well as electron energies. For the secondary emission by a low-energy PE beam, the angular distributions of SEs and BSEs respectively conform Lambert's law (proportional to cos φ, where φ is emission angle relative to the surface normal of the specimen). The large spread in emission angles makes it difficult to realize a pure energy-depending filtering, and the real filtering function depends on electron emission angle more or less. In addition, because of the deflection effect of the deflector(s) and the geometric magnification effect of the objective lens on the trajectories of the SEs and BSEs, the incident situations of SEs and BSEs, when entering the energy filter, change with the original locations on the field of view (FOV) of the specimen surface. For example, the beam of SEs from the FOV center is incident onto the entrance of the energy filter along the optical axis thereof, while the beam of SEs from an edge point of the FOV has 2° incident angle and 3 mm off-axis shift (both relative to the optical axis). Consequently, the filtering function of the energy filter actually also depends on the original positions of electrons on the FOV more or less, thereby being position-depending filtering to a certain degree.

The available energy filters can be classified into two types, dispersion (axial or radial) type and reflection type. An energy filter of axial or radial dispersion type uses a dispersive element to make electrons with different energies generate different displacements in axial or radial direction correspondingly, while an energy filter of reflection type uses a potential barrier to reflect back the electrons with initial kinetic energies not higher than a specific value so as to prevent them from passing through. The dispersive element can be a lens (U.S. Pat. Nos. 7,544,937, 7,683,317) or a deflector (U.S. Pat. No. 7,276,694), and the potential barrier can be an equipotential formed by a hollow electrode (U.S. Pat. No. 7,335, 894) or a grid electrode (U.S. Pat. Nos. 7,141,791, 7,544,937, 7,683,317, 7,714,287, 8,203,119). Energy filters of axial dispersion and reflection types are well used individually or in combination in the LVSEM due to being compact and simple in configuration.

Accordingly, the filtering function of the energy filter can be evaluated by energy-discrimination power at the FOV center and uniformity of energy-discrimination powers over the entire FOV within the required range (such as 0.2 eV~5 keV for a LVSEM) of the landing energy of the PE beam. The energy-discrimination power for a point in the FOV is the variation of energy thresholds with respect to the emission angle spread, while the uniformity of energy-discrimination powers over the entire FOV is the variation of the energy thresholds of the chief rays (with 0° emission angles) coming from the entire FOV. For the energy filter of reflection type such as the energy filter 3 in front of the detector 7 in FIG. 1A, if the energy thresholds for 0° emission angle (the chief ray 2c) and 45° emission angle (the margin ray 2m) of the SEs from the center point Bo of the FOV on the surface of the specimen 4 are 2 eV and 2.1 eV respectively, the energy-discrimination power is 0.1 eV with respect to 45° emission angle spread for the FOV center. If the energy thresholds of the chief rays over the entire FOV of 50 um×50 um square are within the range of 2 eV-3 eV, the uniformity of the energy-discrimination powers over the entire FOV is equal to the range, i.e., 1 eV. The lower the variation of the energy thresholds for the FOV center is, the fine the energy-discrimination power will be; while the lower the range of the energy thresholds of the chief rays over the FOV covers, the higher the uniformity of the energy-discrimination powers will become.

Energy filters of reflection type can be placed near the specimen surface or the detector, as shown in FIGS. 1B and 1C. In both FIGS. 1B and 1C, the PE beam 1 is finally focused by the objective lens 5 and lands on the specimen 4. The electron beam 2 of secondary emission is emitted from where the specimen 4 is excited by the PE beam 1, which comprises SEs such as the SEs 2_1 and BSEs such as the BSEs 2_2. In FIG. 1B, the hollow electrode 6 is negatively biased with respect to the specimen 4 to form a potential barrier PB1 therebetween, and the SEs 2_1 with initial kinetic energies not higher than the energy thresholds with respect to the potential barrier PB1 are therefore reflected back to the specimen 4 and the other SEs and BSEs can pass the potential barrier and can be detected by the detector 7. This method can not be used to an application requiring a strong extraction field on the specimen surface to make more electrons escape from specimen surface or get high resolution. In FIG. 1C, the grid electrode 8 is negatively biased with respect to the specimen 4 and becomes a potential barrier PB2 itself, and SEs 2_1 with energies not higher than the energy thresholds with respect to the potential barrier PB2 are reflected back.

For an energy filter of reflection type, if the electrons which come from the FOV center with same energies and different emission angles can approach the potential barrier with substantially equal angles of incidence (relative to the correspondingly local normal of the potential barrier) such as shown in FIGS. 2A and 2B, the energy-discrimination power will become finer. Meanwhile, if the electrons of the chief rays which come from the entire FOV with same energies can also approach the potential barrier with substantially equal angles of incidence, the uniformity of the energy-discrimination powers over the FOV will become higher. If the potential barrier has a shape of sphere (corresponding to a focused beam) or plane (corresponding to a parallel beam), it is possible to meet the foregoing requirements. In the light of the potential barrier shape, the potential barrier formed by a hollow electrode (such as in U.S. Pat. No. 7,335,894) has a shape of hyperboloid and therefore is not advantageous than the potential barrier formed by a flat grid electrode in getting a fine energy-discrimination power. Furthermore, although the hollow electrode incurs no electron loss due to lack of the electrons hitting on the wires of the grid electrode, the dramatically deteriorated energy-discrimination power due to the strong energy-angle-depending filtering and position-depending filtering puts a limitation onto the acceptable emission angle spread and the acceptable size of the FOV, thereby limiting the intensity of the image signal and the throughput of the application.

Among the foregoing patents using a grid electrode to form a potential barrier, some (U.S. Pat. Nos. 7,683,317 and 8,203, 119) assume the secondary emission beam is parallel when entering the energy filter and thereafter attempt to keep it parallel and normally incident onto the potential barrier, some (U.S. Pat. Nos. 7,141,791 and 7,714,287) adjust the incident direction of the secondary emission beam with respect to the position thereof in the FOV before entering the energy filter, and some (U.S. Pat. No. 7,544,937) makes the grid electrode with a special shape to fit the secondary emission beam. The foregoing cases either can only work well within a small emission angle spread and a small FOV, or needs at least an additional element for specially adjusting the secondary emission beam before entering the energy filter or a complex grid. To reduce the emission angle spread to fit the energy filter, a lot of electrons with large emission angles in the secondary emission beam have to be cut off, thereby reducing the number of the detected signal electrons. To get a stronger image signal, the scanning speed has to be slow down to increase the integration time of each pixel in the image. The small FOV corresponds to a low throughput of observation because more moving steps are required to observe a large area on the specimen surface. The additional space is thus needed to accommodate the additional adjusting element(s), thereby making the entire apparatus bulky. Apparently, in the available energy filters of reflection type, there is no means for directly improving the incident situation of a secondary emission beam on the potential barrier if the secondary emission beam is not parallel when entering the energy filter.

In addition, for an energy filter of reflection type using a grid electrode to form a potential barrier, the wires of the grid electrode block some of the signal electrons and thereby incurring a loss of the signal electrons. To compensate the loss, it is conventionally either increasing the integration time of each pixel in the image or enhancing the amplifier amplification of the detector. The former makes the observation slow down and the later induces strong electric noise.

Accordingly, an energy filter for energy-discrimination detection in a LVSEM, which can provide a fine energy-discrimination power within a large emission angle spread and a high uniformity of energy-discrimination power over a large FOV, is needed. Such an energy filter will be more advantageous to improve the image contrast than the prior of art.

BRIEF SUMMARY OF THE INVENTION

The object of this invention is to provide an energy filter of reflection type to realize energy-discrimination detection in a charged particle apparatus. By specifically providing a means inside the energy filter to directly adjust the incident situation of a charged particle beam onto a potential barrier of the energy filter, the energy filter can provide a fine energy-discrimination power at a center of a FOV and a high uniformity of energy-discrimination powers over the entire FOV. Furthermore, by specifically arranging detectors associated with the energy filter to separately detect SEs and BSEs within different energy ranges, images respectively comprising topography contrast and/or voltage contrast, and material contrast can be obtained simultaneously. In addition, by specifically placing an electron-multiplication means in front of one detector to directly increase the number of signal electrons landing thereon, the image signal can be enhanced without noise raise. Hence, this invention provides an effective way to realize energy-discrimination detection which can provide multiple images with high contrast and high resolution in a LVSEM and the related apparatuses based on LVSEM principle, such as the defect inspection and defect review in semiconductor yield management.

Accordingly, the invention provides a means to improve the filtering function of an energy filter of reflection type. The means uses a beam-adjusting lens on the entrance side of the potential barrier of the energy filter to make an incident charged particle beam become a substantially parallel beam to be incident onto the potential barrier.

The invention therefore provides an energy filter for a charged particle beam, which comprises a filtering grid electrode being set at a first potential to form a potential barrier, and a beam-adjusting lens being excited to make the charged particle beam become a substantially parallel beam to be incident onto the potential barrier. A first plurality of particles of the charged particle beam, which has initial kinetic energies higher than a specific value and thus is able to cross the potential barrier, passes through the filtering grid electrode and forms an exiting beam, while a second plurality of particles of the charged particle beam, which has initial kinetic energies not higher enough to be able to cross the potential barrier, is reflected back from the filtering grid electrode and forms a reflection beam. An optical axis of the beam-limiting lens is an optical axis of the energy filter.

In the energy filter, the filtering grid electrode is perpendicular to and aligned with the optical axis of the beam-limiting lens. The charged particle beam can enter the energy filter along the optical axis thereof. The charged particle beam also can enter the energy filter with an angle and a radial shift both with respect to the optical axis thereof. The beam-adjusting lens can be an electrostatic lens which comprises a first electrode, a second electrode and a third electrode. With respect to the charged particle beam, the first electrode and the second electrode are respectively on an entrance side and an exit side of the beam-adjusting lens and the third electrode is between the first electrode and the second electrode. The filtering grid electrode is inside the second electrode. The second electrode is set at the first potential, the first electrode is set at a potential of a neighborhood on the entrance side of the beam-adjusting lens, and a potential of the third electrode is adjusted to make the charged particle beam become a substantially parallel beam to be incident onto the potential barrier.

The invention therefore provides an energy-discrimination detection device for detecting an electron beam, which comprises an energy filter, an electron-multiplication plate and a first detector. The energy filter, same as the foregoing energy filter, comprises a filtering grid electrode being set at a first potential to form a potential barrier, and a beam-adjusting lens below the filtering grid electrode and being excited to make the electron beam become a substantially parallel beam to be incident onto the potential barrier. A first plurality of particles of the electron beam, which has initial kinetic energies higher than a specific value and thus is able to cross the potential barrier, passes through the filtering grid electrode and forms an exiting beam, while a second plurality of particles of the electron beam, which has initial kinetic energies not higher enough to be able to cross the potential barrier, is reflected back from the filtering grid electrode and forms a reflection electron beam. The electron-multiplication plate is placed above the energy filter and comprises one electron-multiplication surface. The electron-multiplication surface is made of electric conductor material which can generate a secondary emission with a total yield higher than 1. The electron-multiplication surface is placed and set at a second potential to attract the first plurality of electrons to land thereon and therefore generate the secondary emission.

The first detector, above the energy filter and beside the electron-multiplication plate, is placed and set at a third potential to receive electrons of a secondary emission beam of the secondary emission. An optical axis of the beam-limiting lens is both an optical axis of the energy filter and an optical axis of the energy-discrimination detection device.

In the energy-discrimination detection device, the filtering grid electrode can be perpendicular to and aligned with the optical axis of the beam-adjusting lens. The energy-discrimination detection device may further comprise a shielding box covering the energy filter and the first detector. The shielding box is made of electric conductor material and has an entrance plate which is below the energy filter, perpendicular to the optical axis thereof and has an entrance grid for the charged particle beam passing through. The shielding box can be set at a potential of a neighborhood where the energy-discrimination detection device is placed.

The energy-discrimination detection device may further comprise a second detector below the entrance grid, wherein the second detector has an opening for a central part of the electron beam passing through and fully or partially detects other part thereof. The energy-discrimination detection device may further comprise a third detector being placed and excited to detect the reflection electron beam.

In the energy-discrimination detection device, the second potential can be adjusted to maximize the total yield so as to enhance an image signal of the first detector. The energy-discrimination detection device may further comprise a shielding grid electrode which can be placed in front of the first detector and set at a fourth potential. The fourth potential is lower enough than the third potential so that the shielding grid electrode is not able to directly attract the first plurality of electrons, but higher enough than the second potential so as to attract electrons of the secondary emission beam.

The invention further provides an electron beam apparatus for observing a surface of a specimen, which comprises an electron source being excited to emit primary electrons along an optical axis of the electron beam apparatus, an accelerating electrode below the electron source and having an opening aligned with the optical axis for primary electrons passing through, a condenser lens below the accelerating electrode and aligned with the optical axis, a beam-limiting aperture plate below the condenser lens and having a plurality of apertures with different radial sizes, a magnetic objective lens below the beam-limiting aperture plate and aligned with the optical axis, a retarding electrode below the magnetic objective lens and having an opening aligned with the optical axis for the primary electron beam passing through, a specimen stage below the retarding electrode and supporting the specimen, a deflection unit between the beam-limiting aperture plate and the retarding electrode, an energy-discrimination detection device above the deflection unit and away from the optical axis and a Wien filter between the specimen and the energy-discrimination detection device.

The accelerating electrode is excited to accelerate primary electrons to have desired first energies. One of the plurality of apertures of the beam-limiting aperture plate is selected as a beam-limit aperture and thus aligned with the optical axis. The condenser lens is excited to make a part of the primary electrons pass through the beam-limit aperture so as to form a primary electron beam with a desired current value. The specimen surface is opposite to the retarding electrode, and both specimen and retarding electrode are excited to decelerate primary electrons of the primary electron beam to land on the specimen surface with desired second energies much lower than the first energies. The magnetic objective lens is excited to focus the primary electron beam to form a focused probe on the specimen surface and the focused probe releases a first secondary emission beam therefrom which comprises secondary electrons and backscattered electrons. The deflection unit deflects the primary electron beam and thus makes the focused probe scan the specimen surface.

The energy-discrimination detection device includes an energy filter, an electron-multiplication plate and a first detector. The energy filter comprises a filtering grid electrode and a beam-adjusting lens. The filtering grid electrode functions as a potential barrier, and the beam-adjusting lens is below the filtering grid electrode and functions as a means for adjusting an incident electron beam of the energy filter to become a substantially parallel beam to be incident onto the potential barrier. A first plurality of electrons of the incident electron beam, which has initial kinetic energies higher than a specific value and thus is able to cross the potential barrier, passes through the filtering grid electrode and forms an exiting electron beam, while a second plurality of electrons of the incident electron beam, which has initial kinetic energies not higher enough to be able to cross the potential barrier, is reflected back from the filtering grid electrode and forms a reflection electron beam. The electron-multiplication plate, above said energy filter, comprises an electron-multiplication surface and functions as a means for receiving the exiting electron beam and therefore generating a second secondary emission beam with a total yield higher than 1. The first detector is above the energy filter and beside the electron-multiplication plate to detect the second secondary emission beam.

The Wien filter can be excited to deflect the first secondary emission beam to be incident onto the energy-discrimination detection device while not deflecting the primary electron beam, and therefore the first secondary emission beam is the incident electron beam of the energy filter. The electron beam apparatus further comprises a second detector above the deflection unit and away from the optical axis, and the Wien filter can be excited to deflect the first secondary emission beam to be detected by the second detector while not deflecting the primary electron beam.

The electron beam apparatus may further comprise a shielding grid electrode placed in front of said first detector and functions as a means for making more of the first plurality of electrons hitting the electron-multiplication surface and attracting more of electrons of the second secondary emission beam towards the first detector.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which:

FIG. 7 is a schematic illustration of a configuration of an energy-discrimination detection device with an entrance beam-limit aperture and an energy filter as shown in FIG. 3A;

FIG. 8 is a schematic illustration of a configuration of an energy discrimination detection device with a beam-focusing lens and an energy filter as shown in FIG. 3A;

DETAILED DESCRIPTION OF THE INVENTION

Figure 1A:
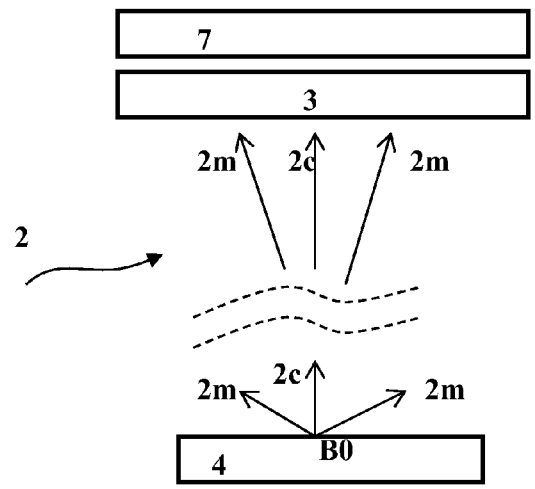
FIGS. 1A-1C are schematic illustrations of energy-discrimination detection in a LVSEM.
Figure 1B:
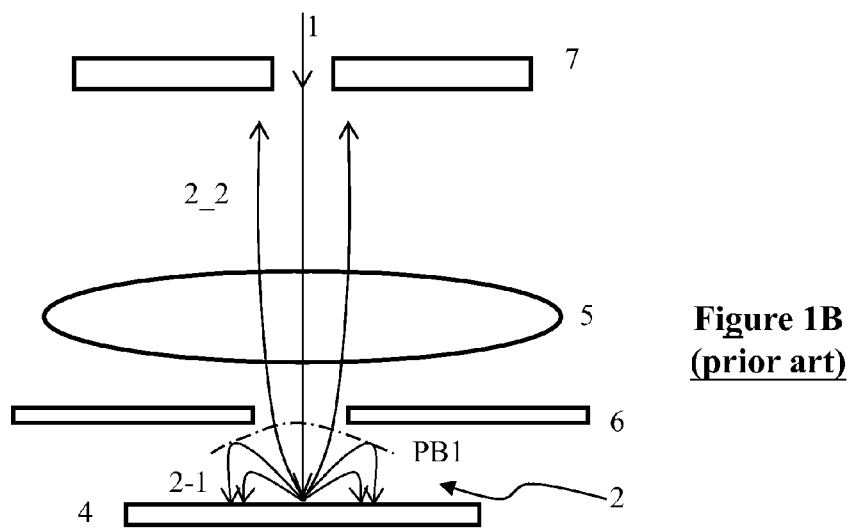
Figure 1C:
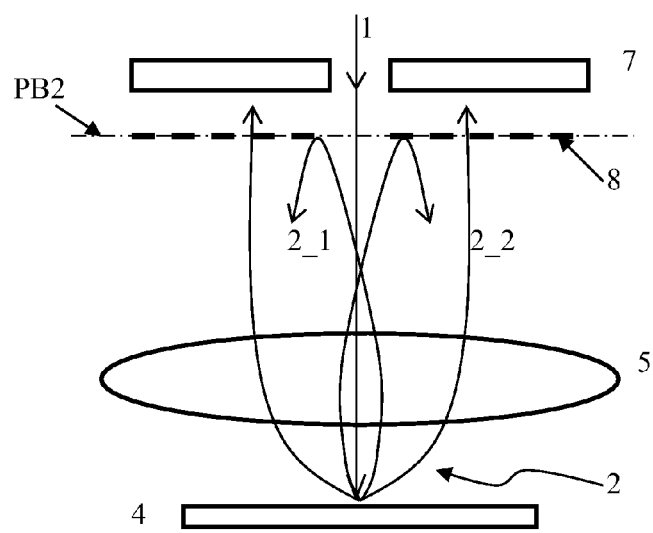
Figure 2A:
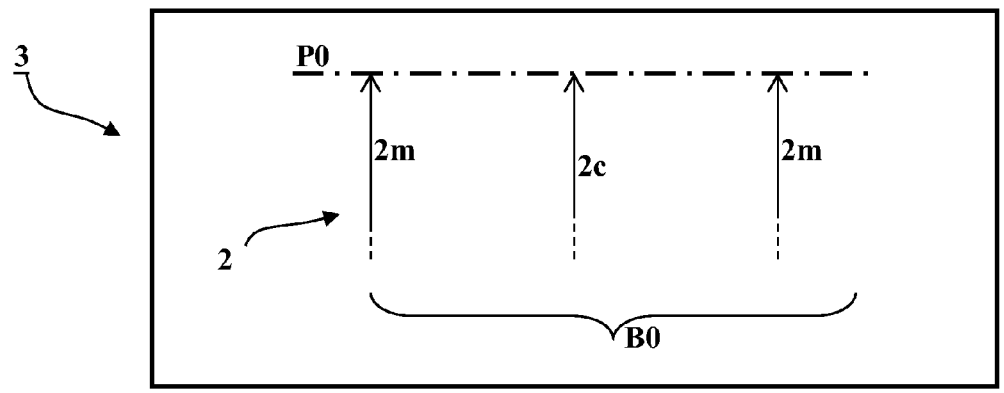
FIGS. 2A and 2B are schematic illustrations of incident situations of a secondary emission beam approaching a potential barrier inside an energy filter.
Figure 2B:
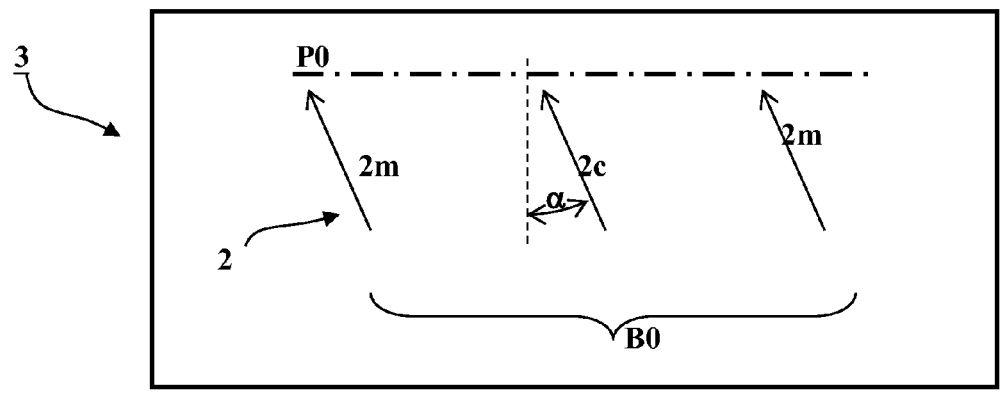

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity.

Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of an apparatus, column or a device such as a lens", while "radial" means "in a direction perpendicular to the optical axis".

In this invention, when one illumination electron beam impinges on a surface, "secondary emission" of the surface means the emission of secondary electrons (energy≤50 eV) and backscattered electrons (50 eV<energy≤energy of the illumination electron beam). "One secondary emission beam" means the beam comprising the secondary electrons and the backscattered electrons. "Yield δ of the secondary emission" means the ratio of the number of secondary electrons and the number of electrons of the illumination electron beam, "Coefficient η of the secondary emission" means the ratio of the number of backscattered electrons and the number of electrons of the illumination electron beam, and "total yield σ of the secondary emission" means the sum of the yield δ and the coefficient η.

Next, the present invention at first provides an energy filter of reflection type and then combines the energy filter with an electron-multiplication means, conventional detectors and beam-limit means to construct basic or advanced energy-discrimination detection devices for a LVSEM.

As well known, an energy filter of reflection type is based on the law of conservation and conversion of energy of a charged particle. For an electron, its total energy is the sum of kinetic energy and potential energy thereof. When the electron moves from an initial place on an equipotential P1 to another place on an equipotential P2, its total energy keeps constant but a conversion between the kinetic energy and the potential energy happens if the potentials $V_1$ and $V_2$ of the two equipotentials P1 and P2 are different. The electron will return back if its speed component in the normal direction of the equipotential P2 (called as normal speed component on the equipotential P2) is reduced to zero when it arrives there. Therefore, to pass the equipotential P2, the kinetic energy of the electron at the initial place (called as initial kinetic energy hereinafter) needs to be higher than a specific value $E_{KT}$ to ensure a non-zero normal speed component. The specific value $E_{KT}$ is the threshold of initial kinetic energy (simply called as energy threshold hereinafter) for an electron coming from the equipotential P1 to pass the equipotential P2. The energy threshold $E_{KT}$ depends on the potential difference of the equipotentials P1 and P2 and the incident situation of the electron on the equipotential P2, as shown in the equation (1) where $v_T$ is the speed component of the electron in the tangent direction of the equipotential P2 (called as tangent speed component on the equipotential P2).

$$E_{KT} = (e \cdot V_2 - e \cdot V_1) + \frac{1}{2} \cdot m \cdot v_T^2 \quad (1)$$

For a certain value of the potential difference $V_2-V_1$, the energy threshold $E_{KT}$ changes with the incident situation of the electron and has the minimum value when the tangent speed component $v_T$ is zero. In the case where the equipotential P2 is plane, apparently, if an electron beam emitted from a place on the equipotential P1 is changed into a parallel beam to be incident onto the equipotential P2, the energy threshold $E_{KT}$ will be the same within the emission angle spread of the electron beam. For an energy filter of reflection type used in an energy-discrimination detection device in a LVSEM, analogously, the specimen surface can be at the equipotential P1, the equipotential P2 can be the potential barrier of the energy filter, and the beam can be a secondary emission beam emitted from a point on the specimen surface. Therefore, if there is a beam-adjusting means inside the energy filter and just in front of the potential barrier thereof, which can make the secondary emission beam become a substantially parallel beam to be incident onto the potential barrier, the energy threshold $E_{KT}$ will be almost the same within the emission angle spread of the secondary emission beam. The variation of the energy thresholds with respect to the emission angle spread is the energy-discrimination power. The more parallel the beam becomes, the smaller the variation of energy thresholds will be and consequently the finer the energy-discrimination power will be.

Figure 3A:
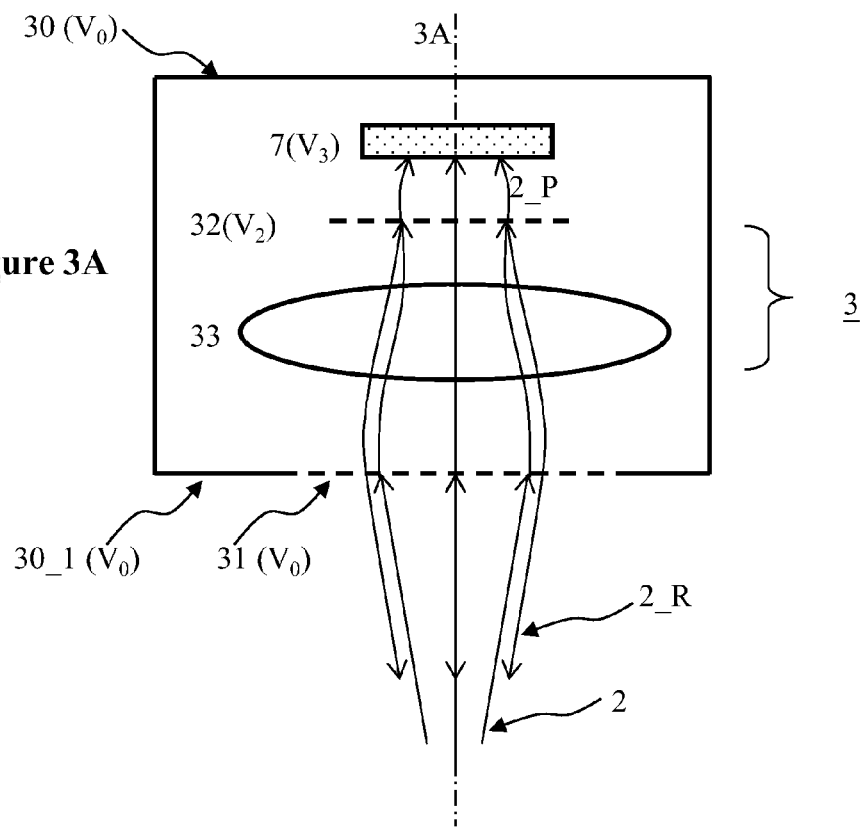
FIGS. 3A and 3B are schematic illustrations of a fundamental configuration of an energy filter in an energy discrimination detection device for a charged particle beam with the normal incidence and an oblique incidence respectively.
Figure 3B:
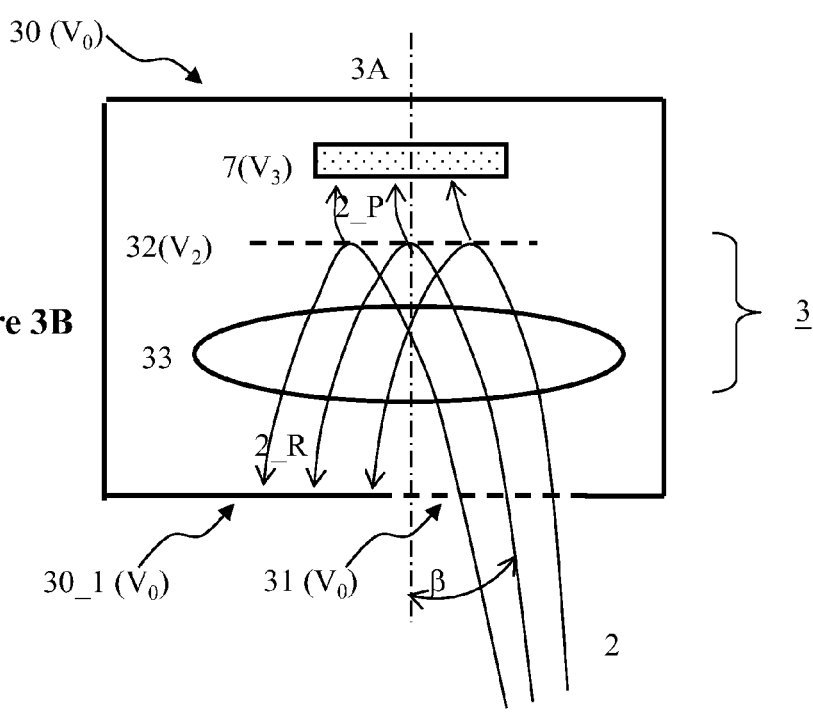

The invention therefore provides an energy filter of reflection type used for energy-discrimination detection in a LVSEM, which basically comprises a grid electrode and a beam-adjusting lens. The grid electrode functions as the potential barrier and the beam-adjusting lens functions as the beam-adjusting means to make an incident electron beam become a parallel beam to be incident onto the potential barrier. FIGS. 3A and 3B show a fundamental configuration of such an energy filter 3 in a configuration of an energy-discrimination detection device 71. The basic units in the detection device 71 are the detector 7 at the potential $V_3$ and the energy filter 3. The energy filter 3 comprises the grid electrode 32 at the potential $V_2$ and the beam-adjusting lens 33. The grid electrode 32 is perpendicular to the optical axis 3A of the beam-adjusting lens 33. The detection device 71 can be used inside or close to the column of the LVSEM. To avoid the mutual influences of the detection device 71 and the column due to the magnetic and/or electrostatic fields generated by each of them, the detection device 71 is covered by a shielding box 30 which has an entrance plate 30_1 with an entrance grid 31. The incident electron beam 2 is a secondary emission beam from the center point of a FOV on a specimen surface at the potential $V_1$, which enters the detection 71 by passing through the entrance grid 31. The shielding box 30 is made of electrical conductor material and at potential $V_0$ equal to the potential of the neighborhood of the detection device 71. If there is at least one magnetic field inside and/or around the detection device 71, the shielding box 30 is required to be made of electric and magnetic conductor material.

In FIG. 3A, the incident electron beam 2 enters the energy filter 3 along the optical axis 3A thereof. The potential $V_2$ of the grid electrode 32 is set with respect to the potential $V_1$ and the desired energy threshold $E_{KT}$ in terms of the equation (1) so as to form the desired potential barrier. For example, if it is desired to reflect back the electrons among the incident electron beam 2 and with initial kinetic energies not higher than 10 eV; i. e. the desired energy threshold $E_{KT}$ is 10 eV, then $V_2$ can be set at −11510 V when $V_1$=−11500 V. For sake of clarity, the grid electrode 32 is also called as filtering grid electrode if necessary. The beam-adjusting lens 33 is excited to make the incident electron beam 2 become a parallel beam to be normally incident onto the grid electrode 32; in other words the electrons of the incident electron beam are normally incident onto the grid electrode 32. The exiting electron beam 2_P comprises the electrons with initial kinetic energies higher than the desired energy threshold $E_{KT}$ and the reflection electron beam 2_R comprises the other electrons.

In FIG. 3A, the reflection electron beam 2_R returns back almost along the path of the incident electron beam 2. For the LVSEM which has a means (such as Wien Filter) to separate the two beams, the reflection electron beam 2_R has no influence on the LVSEM. For the LVSEM without such a means, the reflection electron beam 2_R may become a disturbance source. In this case, it is better to make the reflection electron beams 2_R return back along a path separated from the path of the incident beam 2. To do so, the incident electron beam 2 needs to be obliquely incident onto the grid electrode 32, as shown in FIG. 3B. In FIG. 3B, the incident electron beam 2 enters the energy filter 3 with an angle β of incidence and an off-axis shift or radial shift (both are relative to the optical axis 3A of the beam-adjusting lens 33). Because the angle β and the radial shift influence the tangent speed components of the electrons on the grid electrode 32, i.e. the situations of oblique incidence, the potential $V_2$ of the grid electrode 32 has to be set according to these factors as well as the potential $V_1$ of the specimen surface and the desired energy threshold $E_{KT}$ so as to form the desired potential barrier. Although it is difficult to get an analytical expression about the relationship, the appropriate value of the potential $V_2$ for an application can be obtained by a model simulation or extracted experimentally from the resulting images. The beam-adjusting lens 33 is excited to make the incident electron beam 2 become a parallel beam to be obliquely incident onto the grid electrode 32. The exiting electron beam 2_P comprises the electrons with initial kinetic energies higher than the desired energy threshold $E_{KT}$ and the reflection electron beam 2_R comprises the other electrons. In this case, an angle is formed between the paths of the incident electron beam 2 and the reflection electron beam 2_R, thereby separating the two beams. The reflection electron beam 2_R hits the entrance plate 30_1 and then is absorbed.

Figure 4:
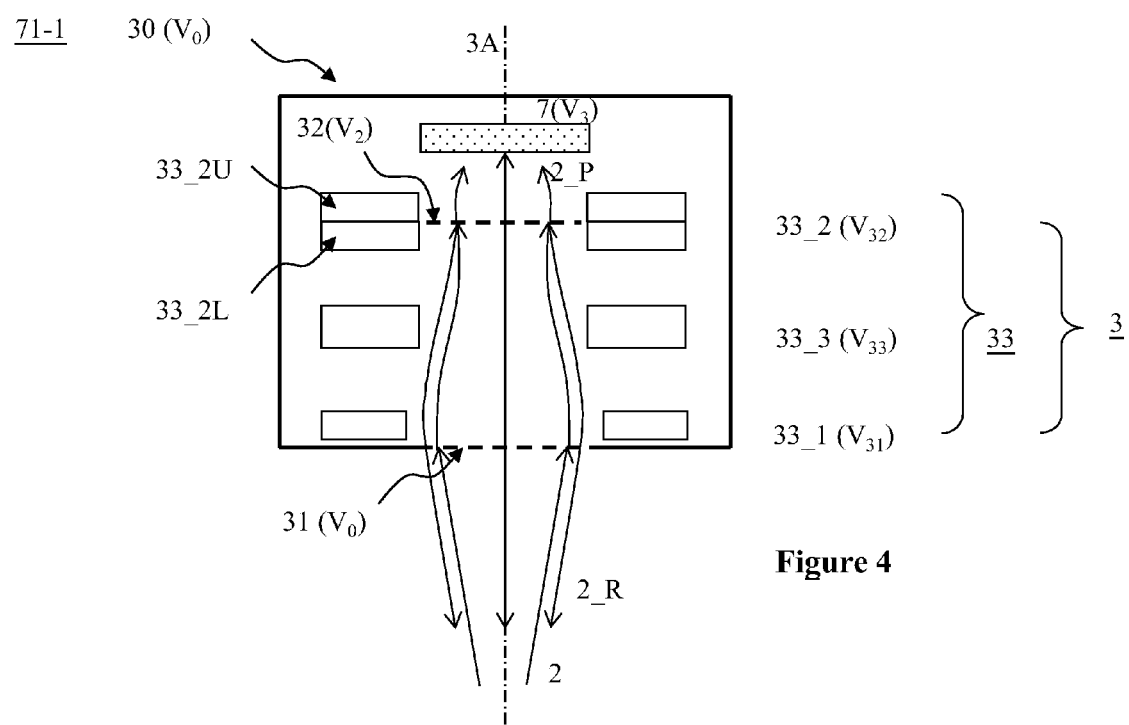
FIG. 4 is a schematic illustration of an energy filter with an electrostatic lens.

The beam-adjusting lens 33 in FIG. 3A can be an electrostatic lens or a magnetic lens. In the case while an electrostatic beam-adjusting lens is used, the electrostatic beam-adjusting lens and the grid electrode together form the retarding field in front of the grid electrode. Hence, the grid electrode is usually close to or even inside an exit electrode of the electrostatic beam-adjusting lens, as shown in FIG. 4. In FIG. 4, the beam-adjusting lens 33 is an electrostatic lens which comprises the entrance electrode 33_1, the exit electrode 33_2 and the adjusting electrode 33_3. The entrance electrode 33_1 is placed above the entrance plate 30 and set at the potential $V_{31}$, while the exit electrodes 33_2 comprises the upper part 33_2U and the lower part 33_2L respectively above and below the grid electrode 32 and at the potential $V_{32}$. The adjusting electrode 33_3 is placed between the entrance electrode 33_1 and the exit electrode 33_2 and set at the potential $V_{33}$. The potentials $V_{31}$ and $V_{32}$ can be simply set to be equal to $V_0$ and $V_2$ respectively, and thus the potential $V_{33}$ is adjusted to make the incident electron beam 2 become a parallel beam to be normally incident onto the grid electrode 32.

FIGS. 5A~5D show simulation results of an energy-discrimination detection device with an energy filter as shown in FIG. 4. The inner diameters of the electrodes 33-1~33_3 are equal to the same value D. The distance $L_1$ between the entrance grid 31 and the grid electrode 32 is equal to 1.4 times of the value D, while the distance $L_2$ between the grid electrode 32 and the detector 7 is equal to half of the value D. The incident electron beam 2 comes from the center point of a FOV on a specimen surface in a LVSEM and enters the energy filter 3 along the optical axis thereof. The electrons of the incident electron beam 2 have emission angles within the range 0°~±40° (± angles are with respect to two emission cases having 180° difference in azimuth). The potential $V_1$ of the specimen surface is −11500V and the potential $V_0$ of the surrounding environment where the energy-discrimination detection device is located is 0V. The desired energy threshold is 10 eV, and therefore the potential $V_2$ of the grid electrode 32 is set at −11510V. Accordingly, the entrance electrode 33_1 and the exit electrode 33_2 are set at 0V and −11510V respectively.

Figure 5A:
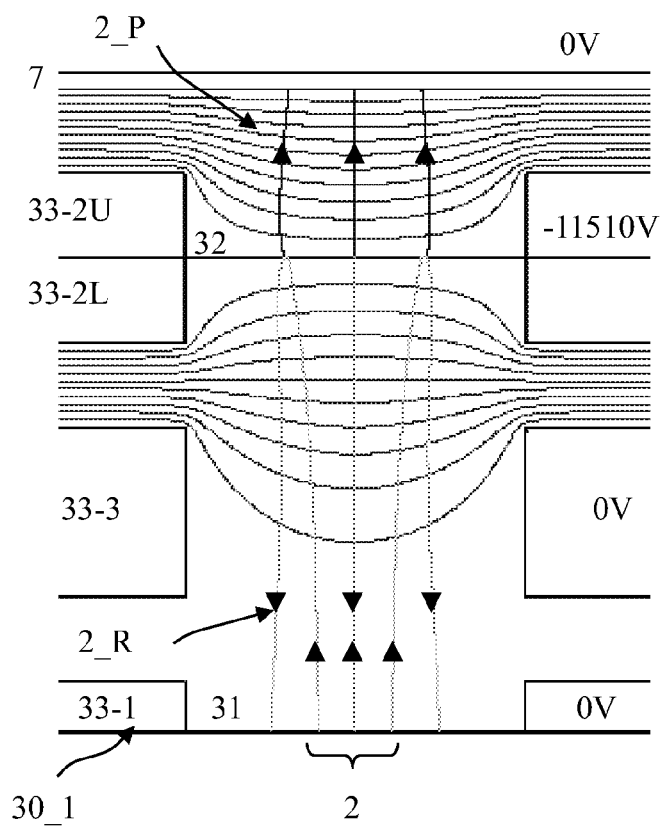
FIGS. 5A~5D show simulation results of beam trajectories and equipotentials of a secondary emission beam in a LVSEM and being normally incident into an energy filter with a structure as shown in FIG. 4.

In FIG. 5A, the potential $V_{33}$ of the adjusting electrode 33_3 is set equal to the potential $V_0$ of the entrance grid 31, similar to the situation that the beam-adjusting lens 33 is absent. The two electrons both with 0° emission angle and respectively having 10.06 eV and 10.05 eV initial kinetic energies approach the grid electrode 32 along the lower central line. The electron with 10.06 eV energy passes through the grid electrode 32 and lands on the detector 7 along the upper central line, while the electron with 10.05 eV energy is reflected back from the grid electrode 32 and returns to the entrance grid 31 along the lower central line. The two electrons both with 40° emission angle and respectively having 20.65 eV and 20.64 eV initial kinetic energies approach the grid electrode 32 along the lower right line close to the lower central line. The electron with 20.65 eV energy passes through the grid electrode 32 and lands on the detector 7 along the upper right line, while the electron with 20.64 eV energy is reflected back from the grid electrode 32 and returns to the entrance grid 31 along the lower most right line. The lines on the left side of the lower and upper central lines are the trajectories of two electrons both with −40° emission angle and having 20.65 eV and 20.64 eV initial kinetic energies respectively. Therefore, the energy thresholds with respect to 0° and ±40° emission angles are 10.05 and 20.64 eV respectively, and consequently the energy-discrimination power is 10.59 eV.

Figure 5B:
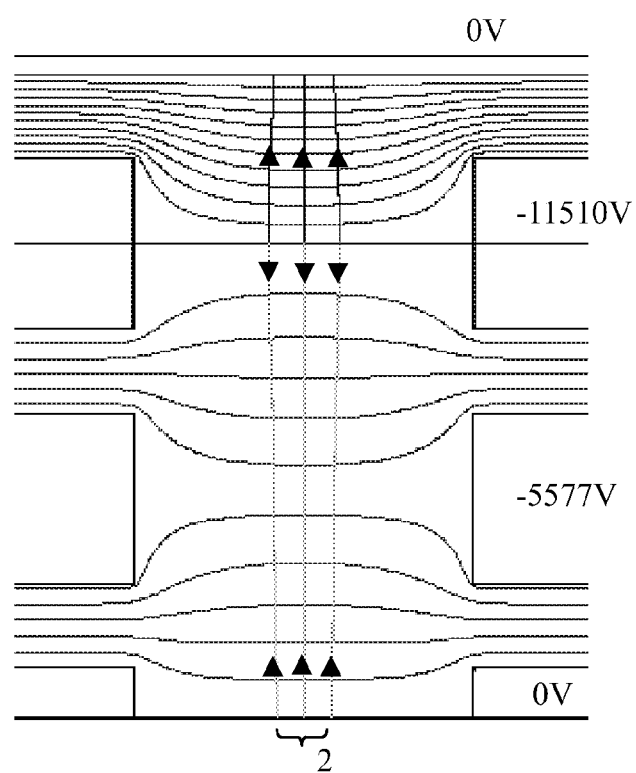

In FIG. 5B, the potential $V_{33}$ of the adjusting electrode 33_3 is set at −5577V so as to adjust the incident situation of the incident electron beam 2 onto the grid electrode 32; i.e. the beam-adjusting lens 33 is active. Due to the electrostatic field of the beam-adjusting lens 33, the incident electron beam 2 becomes a parallel beam and the electrons thereof are substantially normally incident onto the grid electrode 32. The paths of the incident electron beam 2 and the reflection electron beam 2_R are almost overlapped and difficult to be distinguished. In this case, the energy thresholds with respect to 0° and ±40° emission angles are 10.02 and 10.01 eV respectively, and consequently the energy-discrimination power is 0.01 eV, which is much better than that when the beam-adjusting lens off.

Figure 5C:
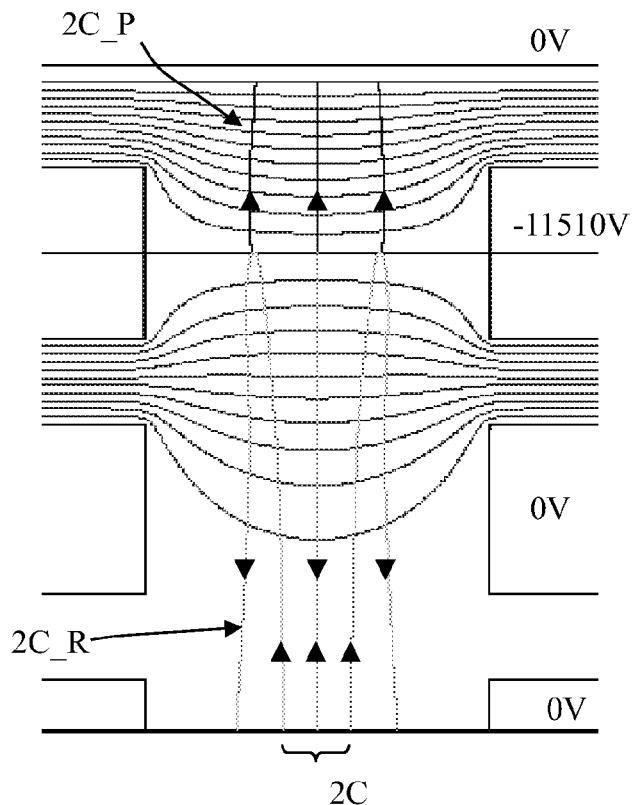
Figure 5D:
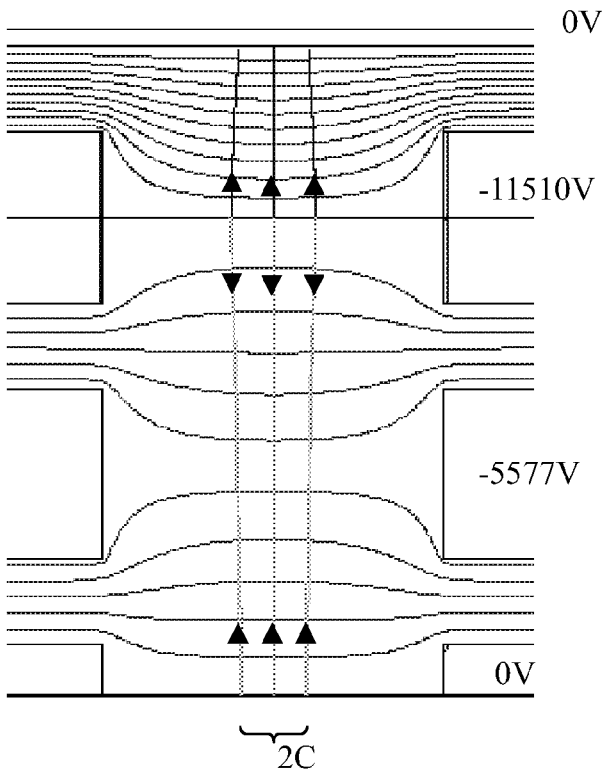

FIGS. 5C and 5D show the improvement of the uniformity of energy-discrimination powers over the entire FOV of 50 um×50 um square when the beam-adjusting lens is off and active respectively, wherein emission angles of all the electrons in the incident electron beam 2C are equal to 0°. In FIG. 5C, the adjusting electrode 33_3 is set at 0V, similar to the situation that the beam-adjusting lens 33 is absent. The upper and lower central lines show the trajectories of the two electrons with 0° emission angle in FIG. 5A. Two electrons approach the grid electrode 32 along the lower right line close to the lower central line, which are both emitted from one of the two edge points on a diagonal of the FOV and with 19.34 eV and 19.33 eV initial kinetic energies respectively. The electron with 19.34 eV energy passes through the grid electrode 32 and lands on the detector 7 along the upper right line, while the electron with 19.33 eV energy is reflected back from the grid electrode 32 and returns to the entrance grid 31 along the lowermost right line. The lines on the left side of the lower and upper central lines are the trajectories of two electrons both emitted from the other of the two edge points on the diagonal of the FOV and with 19.34 eV and 19.33 eV initial kinetic energies respectively. Therefore, the energy thresholds with respect to the FOV center and the FOV edges are 10.05 eV and 19.33 eV respectively, and consequently the uniformity of energy-discrimination powers over the entire FOV is 9.28 eV.

In FIG. 5D, the potential $V_{33}$ of the adjusting electrode 33_3 is set at −5577V, same as that in FIG. 5B. Due to the electrostatic field of the beam-adjusting lens 33, the incident electron beam 2C becomes a substantially parallel beam and the electrons thereof are substantially normally incident onto the grid electrode 32. The paths of the incident electron beam 2C and the reflection electron beam 2C_R are almost overlapped and difficult to be distinguished. In this case, the energy thresholds with respect to the FOV center and the FOV edges are 10.02 eV and 10.03 eV respectively, and consequently the uniformity of energy-discrimination powers over the entire FOV is 0.01 eV, which is much better than that when the beam-adjusting lens off.

Figure 6A:
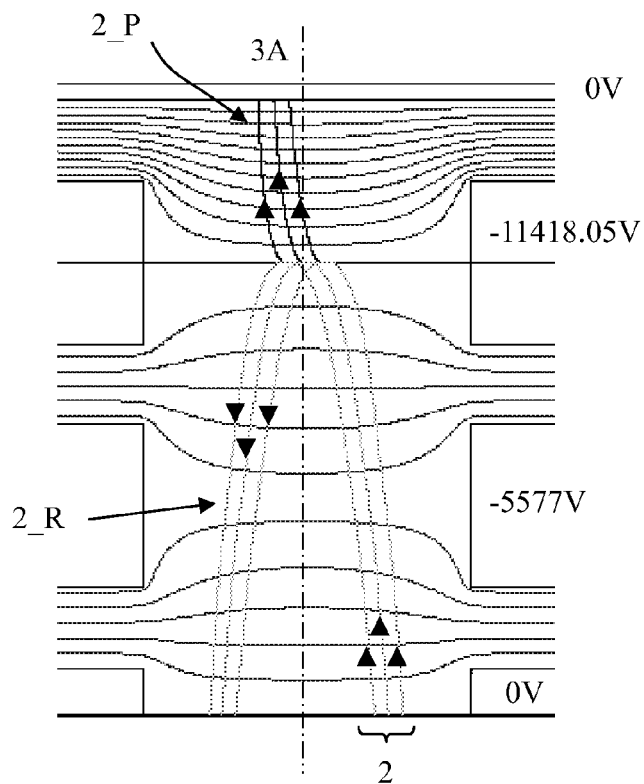
FIGS. 6A and 6B show simulation results of beam trajectories and equipotentials of a secondary emission beam in a LVSEM and being obliquely incident into the energy filter shown in FIGS. 5A~5D.
Figure 6B:
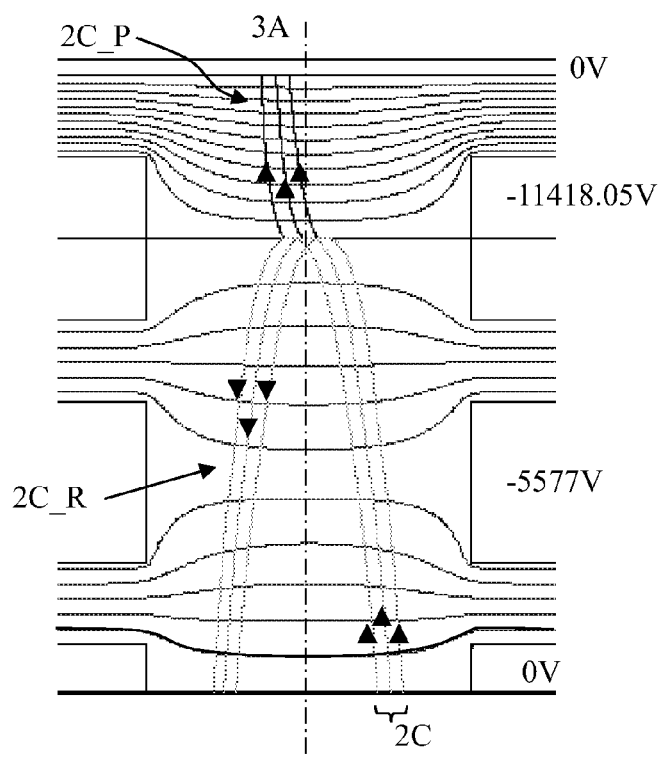

FIGS. 6A and 6B show simulation results when the incident electron beam 2 obliquely enters the foregoing energy-discrimination detection device with 4.2° angle of incidence and the off-axis shift equal to half of the value D. In FIGS. 6A and 6B all the potentials are same as that in FIGS. 5B and 5D except the potential $V_2$. The potential $V_2$ is set −11418.05V so as to realize the same desired energy threshold as that in FIGS. 5A~5D.

In FIG. 6A, the incident electron beam 2 comes from the center point of a FOV on a specimen surface in a LVSEM and includes the electrons with 0° ~±20° emission angles. Due to the electrostatic field of the beam-adjusting lens 33, the incident electron beam 2 becomes a substantially parallel beam to be incident onto the grid electrode 32. The paths of the incident electron beam 2 and the reflection electron beam 2_R are respectively on the right and left sides of the optical axis 3A. In this case, the energy thresholds with respect to 0°, 20° and −20° emission angles are 10.02, 10.62 eV and 12.45 respectively, and consequently the energy-discrimination power is 2.43 eV with respect to 0° ~±20° emission angles, which is much better than that when the beam-adjusting lens off. When the adjusting electrode is set at 0V, the energy-discrimination power already deteriorates to 35 eV with respect to 0° ~±10° emission angles.

In FIG. 6B, the incident electron beam 2C includes the electrons emitted from the entire FOV of 20 um×20 um square on the specimen surface and with 0° emission angles. In this case, the energy thresholds with respect to the FOV center and two edge points on a diagonal of the FOV are 10.02 eV, 10.06 eV and 12.22 eV respectively, and consequently the uniformity of energy-discrimination powers over the entire FOV is 2.2 eV, which is much better than that when the beam-adjusting lens off. When the adjusting electrode is set at 0V, the uniformity of energy-discrimination powers over the FOV of 10 um×10 um square already degrades to 25.2 eV.

It is clear that the performance of the energy filter 3 is better for the incident electron beam in normal incidence than in oblique incidence. That is because the aberrations of the beam-adjusting lens 33 become large when the incident electron beam passes it with a large off-axis shift and a large angle of incidence. The large aberrations generate large differences among incident situations of the electrons onto the potential barrier. To reduce the aberrations, the structure of the beam-adjusting lens can be further optimized or comprise more electrodes.

The energy-discrimination detection device using the foregoing energy filter 3 can be varied so as to have more functions to meet the special needs of some applications. Based on the energy-discrimination detection device 71 in FIGS. 3A and 3B, next the present invention provides several means to construct energy-discrimination detection devices with diversified functions.

If the interested features on a specimen surface are trenches with high aspect ratio (depth to width), for the secondary electrons generated on the bottom of a deep trench, only those with small emission angles can escape from the trench. For the applications of this kind, the image contrast will be better if the detector only detects the electrons with small emission angles. Therefore it would be better if the energy-discrimination detection device can choose the emission angle spread of the incident electron beam. In the energy-discrimination detection device 72 in FIG. 7, the aperture plate 34 with a plurality of apertures is placed below the entrance grid 31 and perpendicular to the optical axis 3A. The apertures of the aperture plate 34 have different radial sizes. One of the apertures is selected and aligned with optical axis 3A to limit the incident electron beam so that the incident electron beam finally enters the energy filter 3 with the desired emission angle spread. The selected aperture is the beam-limiting aperture for the energy filter 3. The aperture plate 34 is made of electrostatic material and preferred to be set at the potential $V_0$.

For the application requiring a large emission angle spread and/or a large FOV, the electron beam 2_P may have a lager beam size after exiting the energy filter 3. Usually the detector 7 is positively biased with respect to the specimen surface to make the signal electrons impinge thereon with high landing energies so as to get a high gain. Hence, there is an accelerating field between the energy filter 3 and the detector 7, which will focus the electron beam 2_P to a certain degree. Because the detection area of a detector cannot be too large due to the limitation of electric respond characteristics, the beam size of the electron beam 2_P may be still larger than the detection area of the detector 7. In this case, it would be better if the energy-discrimination detection device can adjust the size of the exiting electron beam on the detector. In the energy-discrimination detection device 73 in FIG. 8, a beam-focusing lens 35 is placed between the energy filter 3 and the detector 7. The beam-focusing lens 35 is excited to reduce the beam size of the exiting electron beam 2_P on the detector 7. The beam-focusing lens 35 can be an electrostatic lens or a magnetic lens. Please return back to FIG. 4, wherein the upper part 33_2U of the exit boundary electrode 33_2 actually acts as a focusing lens to a certain degree. The focusing function is obvious on FIGS. 5A-5D.

Figure 9A:
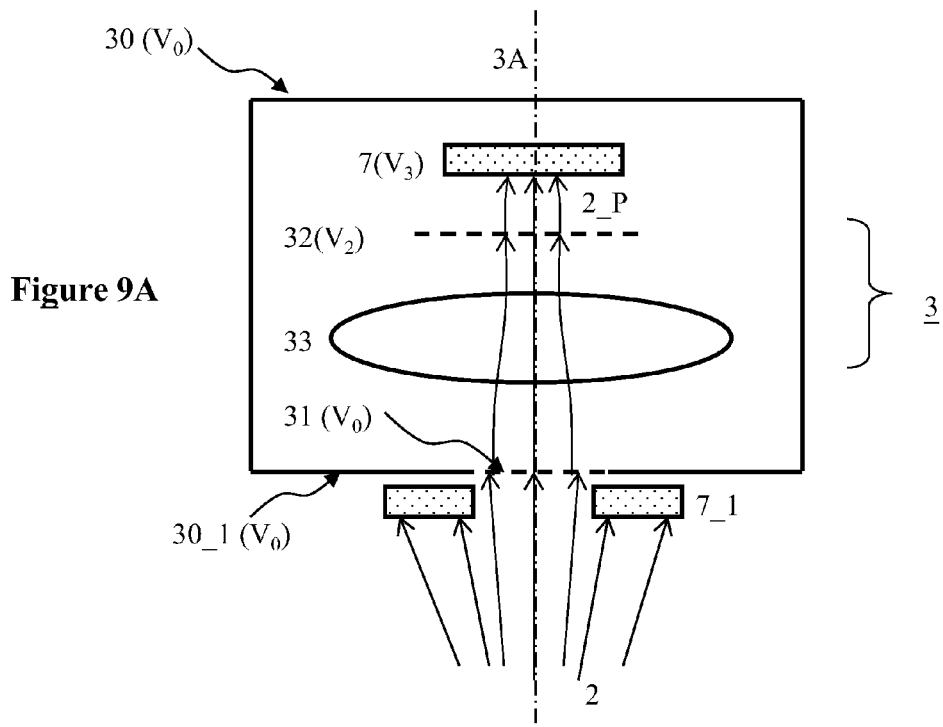
FIGS. 9A~9C are respectively a schematic illustration of a configuration of an energy-discrimination detection device with an energy filter as shown in FIG. 3A and providing more than one kind image signals.

For the application which requires to simultaneously provide multiple images (forming by different signal electrons) of interested features on a specimen surface, the energy-discrimination detection device needs one or more additional detectors. To additionally get dark-field image (formed by signal electrons with large emission angles) in the energy-discrimination detection device 74 shown in FIG. 9A, one dark-field detector 7_1 is additionally placed below the entrance grid 31 to detect the peripheral part of the incident electron beam 2 which comprises electrons with large emission angles. The dark-field detector 7_1 has an opening for the center part of the incident electron beam 2 passing through. To additionally get the SE image (formed by the signal electrons with low initial kinetic energies) in the energy-discrimination detection device 75 shown in FIG. 9B, the incident electron beam 2 is obliquely incident onto the energy filter 3 and one SE detector 7_2 is placed on the path of the reflection electron beam 2_R to detect the electrons thereof. Apparently, the energy-discrimination detection device 76 shown in FIG. 9C can additionally get both the dark-field image and the SE image by the dark-field detector 7_1 and SE detector 7_2 respectively.

Figure 10A:
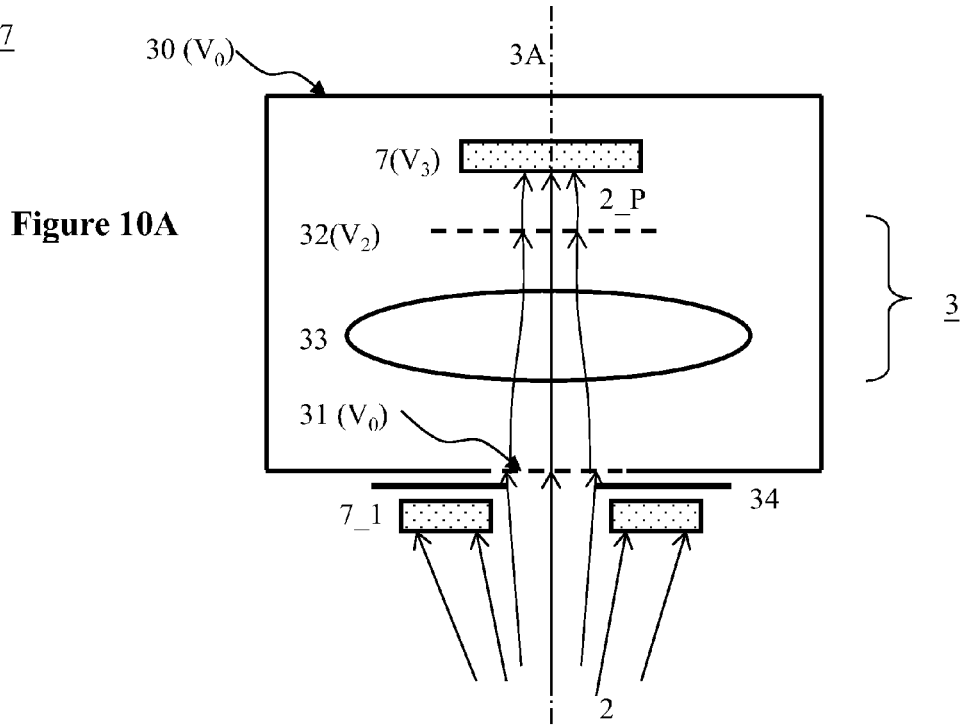
FIGS. 10A and 10B are respectively a schematic illustration of a configuration of energy-discrimination detection device with an energy filter as shown in FIG. 3A, which has an entrance beam-limit and provides more than one kind image signals.
Figure 10B:
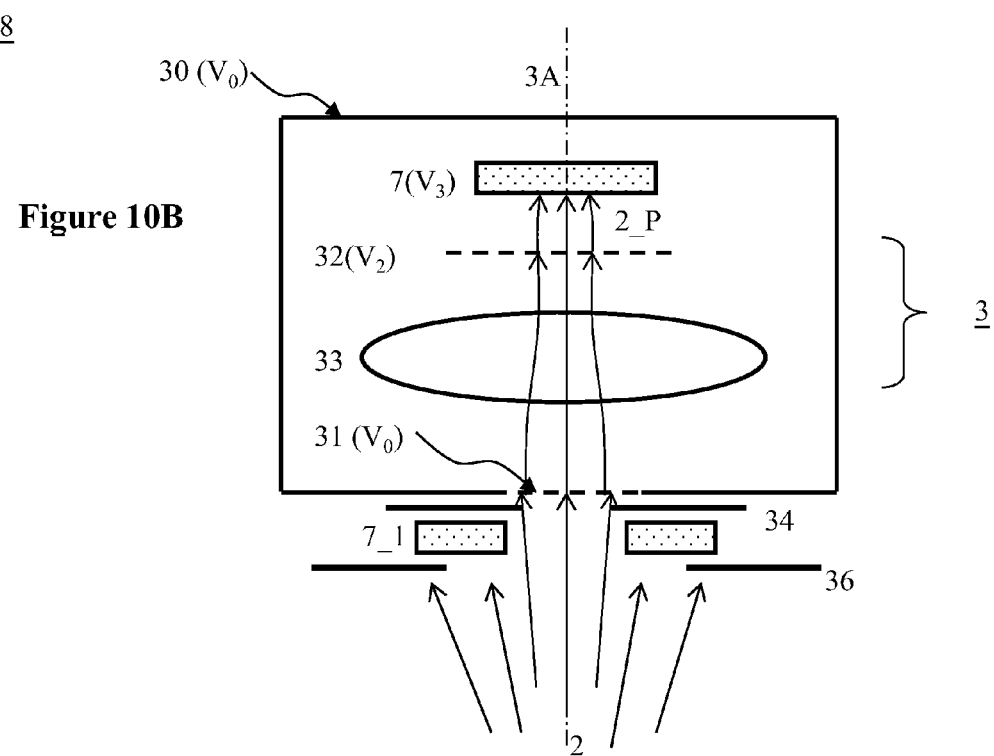

The foregoing means to diversify the functions of the energy-discrimination detection device can be combined in use. In the energy-discrimination detection device 77 shown in FIG. 10A, the aperture plate 34 is placed below the entrance grid 31 to provide a beam-limiting aperture and the dark-field detector 7_1 is placed below the aperture plate 34 to get the dark-field image. Compared with the energy-discrimination detection device 77, the energy-discrimination detection device 78 shown in FIG. 10B additionally uses the aperture plate 36 to provide a beam-limiting aperture for the dark-field detector 7_1. The aperture plate 36 with a plurality of apertures is placed below the dark-field detector 7_1 and perpendicular to the optical axis 3A. The apertures of the aperture plate 36 have different radial sizes. One of the apertures is selected and aligned with optical axis 3A to limit the incident electron beam so that the dark-field detector 7_1 can detect the electrons within the desired emission angle spread. The selected aperture is the beam-limiting aperture for the dark-field detector 7_1. The aperture plate 36 is made of electrostatic material and preferred to be set at the potential $V_0$.

Please return to FIG. 3A, the wires of the grid electrode 32 probably block some of the electrons with initial kinetic energies higher than the desired energy threshold $E_{KT}$, and the blockage reduce the number of electrons of exiting electron beam 2_P and therefore reduce the image signal from the detector 7. The smaller the ratio of the wire interval and the wire width is, the flatter the potential barrier will become. A flatter potential barrier is necessary for a higher energy-discrimination power, but a smaller ratio inevitably results in a weaker image signal. To enhance the image signal without increasing the electric noise or slow down observation, the present invention uses an electron-multiplication means to directly increase the number of electrons hitting the detector 7. The electron-multiplication means has a surface made of an electric conductor material whose total yield σ of secondary emission is higher than 1 with respect to an illumination of charged particle beam, such as gold or graphite. For sake of clarity, the surface is called as electron-multiplication surface. The electron-multiplication means can be a plate with one electron-multiplication surface, or a microchannel plate (MCP) which has an array of miniature electron multipliers oriented parallel to one another ("Microchannel Plate Detectors", Nuclear Instruments and Methods, Vol. 162, 1979, pp 587-601).

Figure 11A:
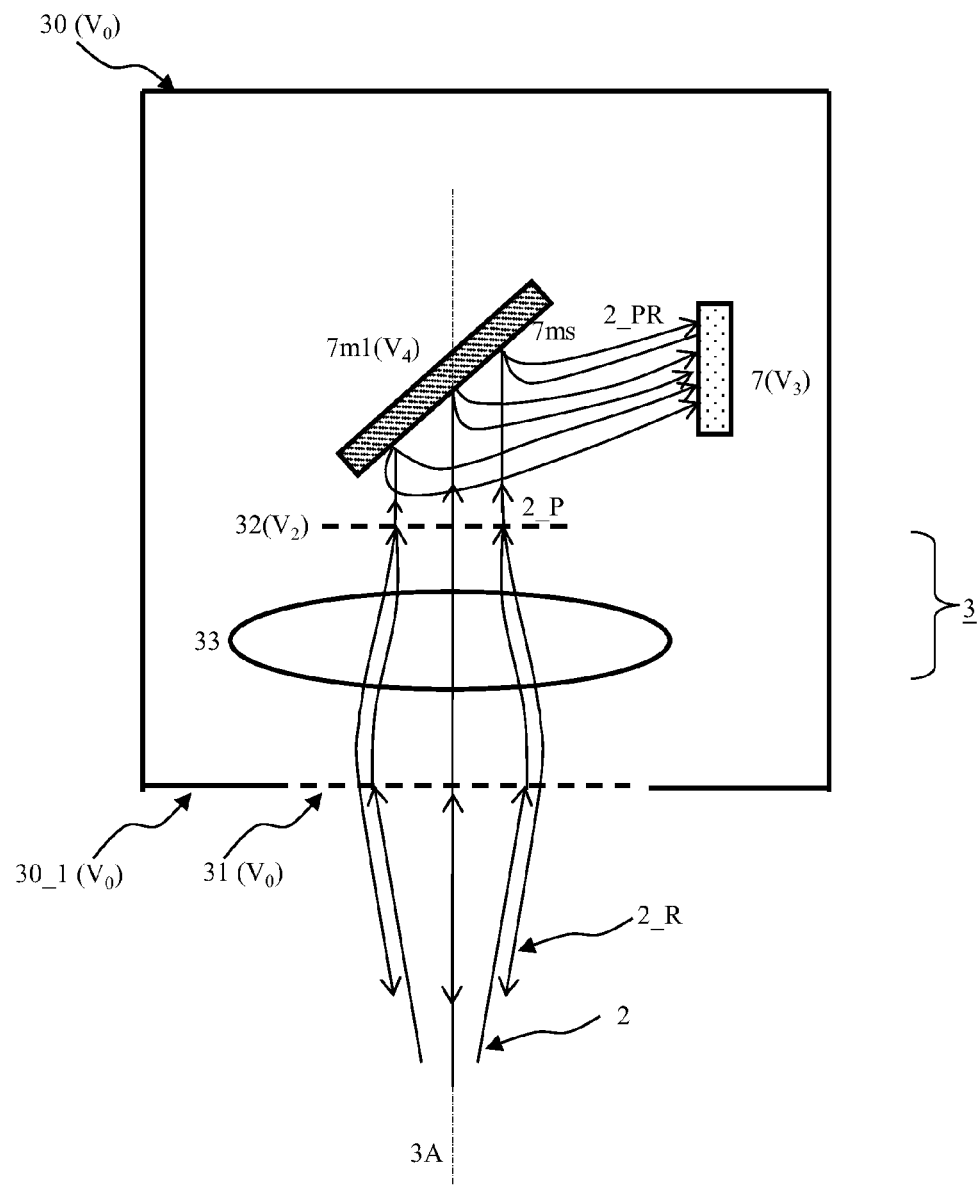
FIG. 11A and FIG. 11B are respectively a schematic illustration of a configuration of energy-discrimination detection device with an energy filter shown in FIG. 3A and an electron-multiplication means in accordance with one embodiment of the present invention.
Figure 11B:
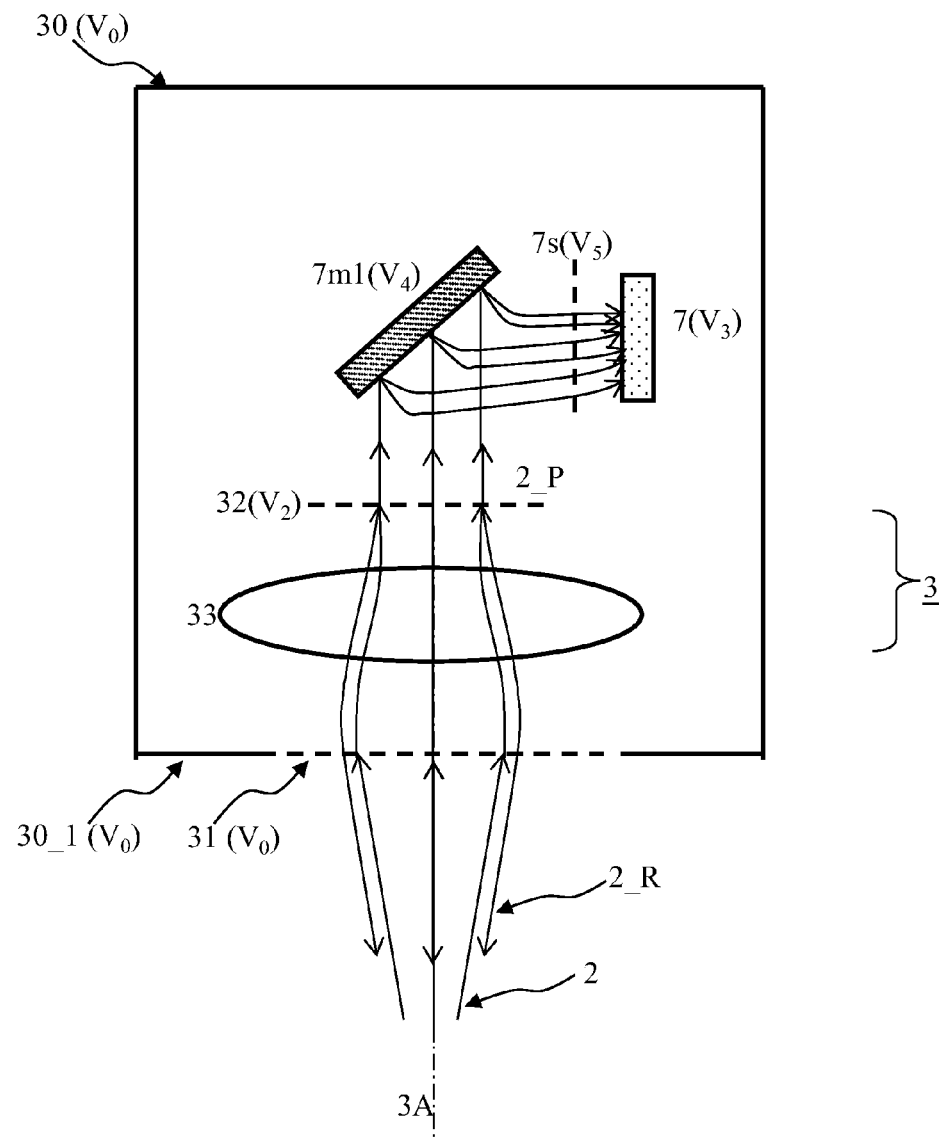

In FIG. 11A, an energy-discrimination detection device 79-1 in according to one embodiment is provided, wherein one electron-multiplication plate 7m1 is placed above the filtering grid electrode 32 and its electron-multiplication surface 7ms is set to attract the electrons of the exiting electron beam 2_P landing on. The exiting electron beam 2_P incurs a secondary emission from the electron-multiplication surface 7ms. As well known, the total yield σ of secondary emission changes with landing energies of incident electrons, the electron-multiplication surface 7ms is therefore set at the potential V4 to tune the landing energies of the electrons of the exiting electron beam 2_P to make the total yield σ higher than 1 or further maximize it as preferred. The detector 7 is set at the potential V3 to attract and receive the electrons of the secondary emission beam 2_PR from the electron-multiplication surface 7ms. To get a high gain, the potential V3 of the detector 7 is usually much higher than the potential V4 of the electron-multiplication surface 7ms. To avoid some or even all of electrons of the exiting electron beam being directly attracted by and landing on the detector 7, the electron-multiplication plate 7m1 is better placed close to the grid electrode 32 and the detector 7 is better kept an appropriate distance from the grid electrode 32. To solve this issue, one shielding grid electrode 7m with a large ratio of wire interval and wire width can be placed in front of the detector 7, as shown in FIG. 11B in which another energy-discrimination detection device 79-2 in according to one embodiment is provided. The shielding grid electrode 7s is set at the potential $V_5$, which is much lower than the potential V3 of the detector and not able to directly attract the electrons of the exiting electron beam 2_P, but higher enough than the potential $V_4$ of the electron-multiplication surface 7ms and able to attract almost all of the electrons of the secondary emission beam 2_PR.

Figure 11C:
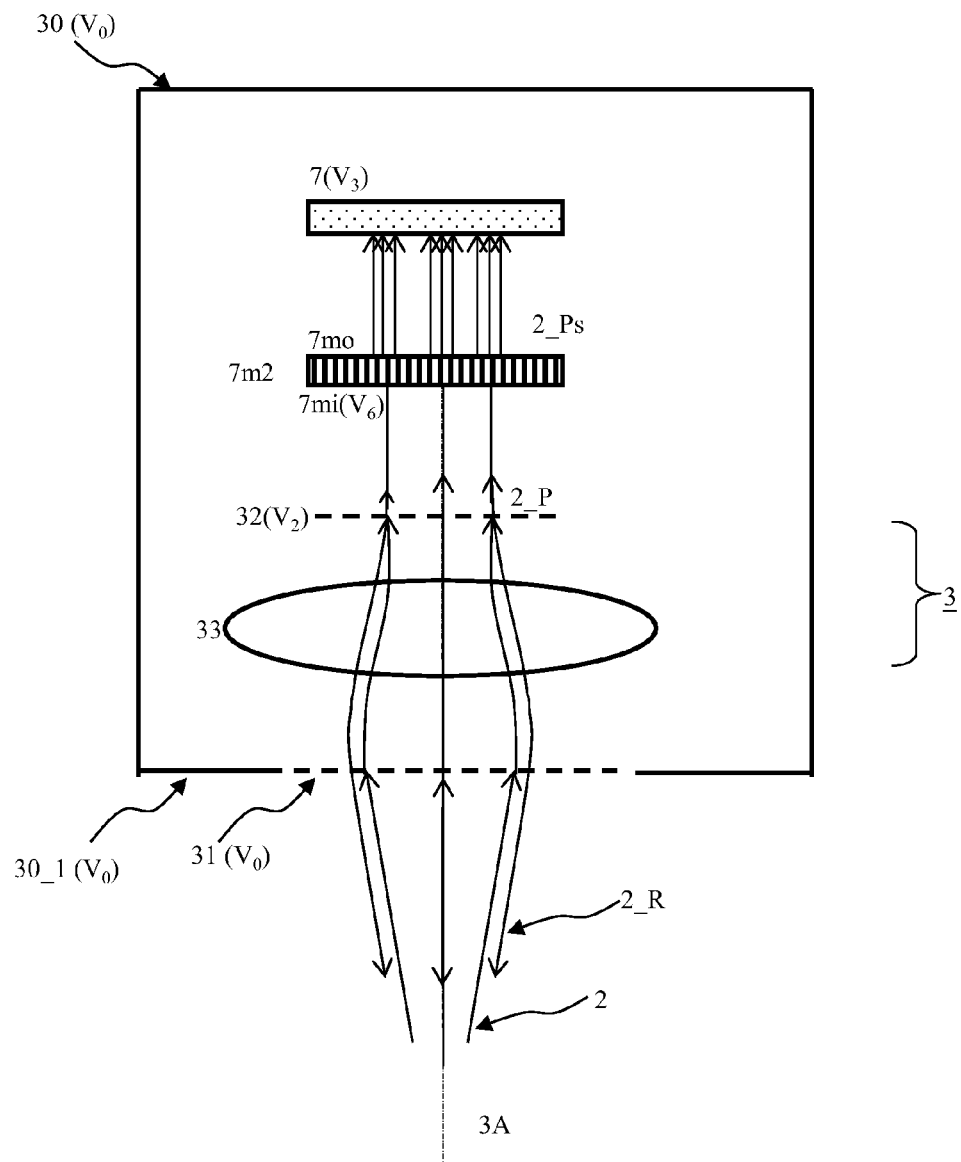
FIG. 11C is a schematic illustration of a configuration of energy-discrimination detection device with an energy filter shown in FIG. 3A and a microchannel plate (MCP) in accordance with one embodiment of the present invention.

In FIG. 11C, an energy-discrimination detection device 79-3, using a MCP as an electron-multiplication means, is provided as one embodiment. The MCP 7m2 is placed between the filtering grid electrode 32 and the detector 7. The channel axes and the voltage V6 of the input surface 7mi of the MCP 7m2 are set to receive the electrons of the exiting electron beam 2_P and therefore generate sequential secondary emissions inside one channel. The electrons exiting from the outer surface 7mo of the MCP 7m2 are received by the detector 7.

Figure 9B:
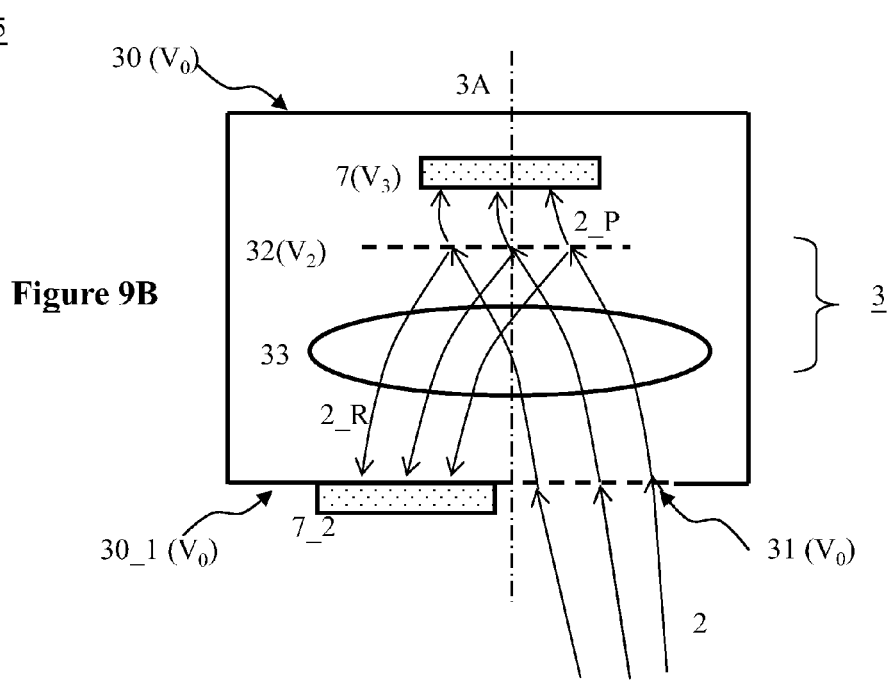
Figure 9C:
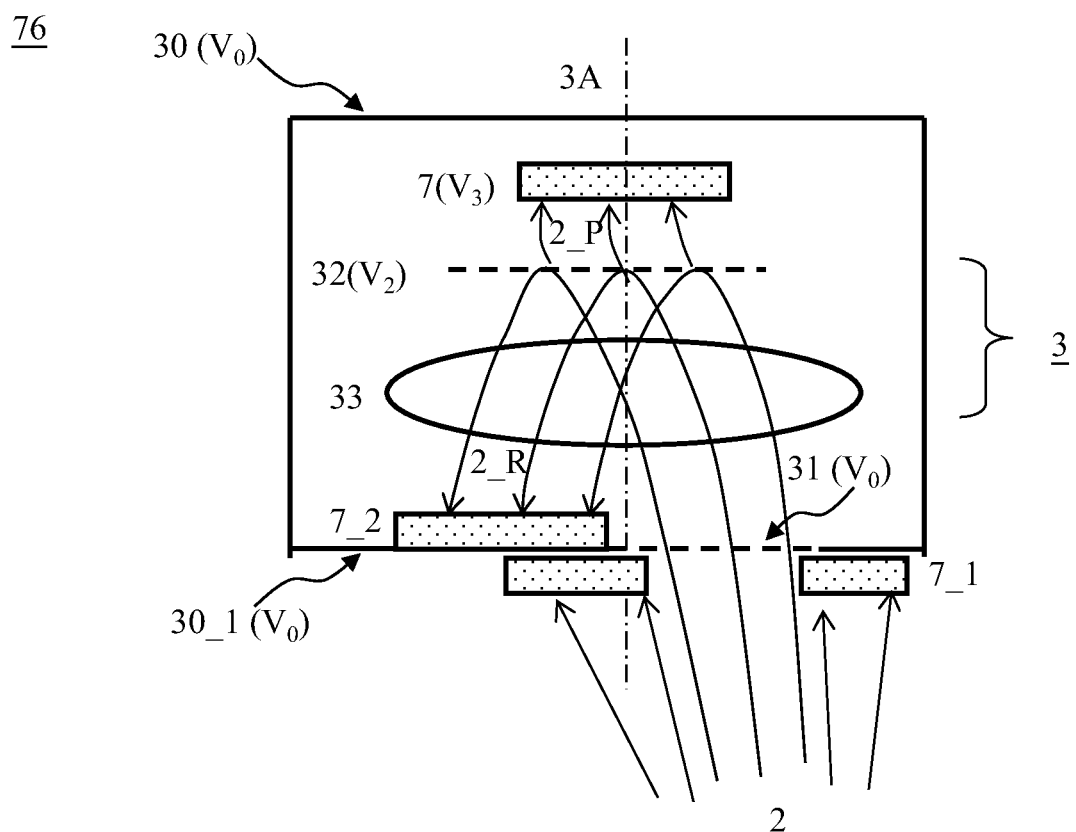

The method of using an electron-multiplication means to enhance the image signal of a detector can also be used to the detection of the reflection electron beam 2_R. In FIG. 9B, for example, an electron-multiplication plate can be placed to receive the reflection electron beam 2_R at first and the secondary emission beam thereof is then directed to be received by the SE detector 7_2.

Figure 12:
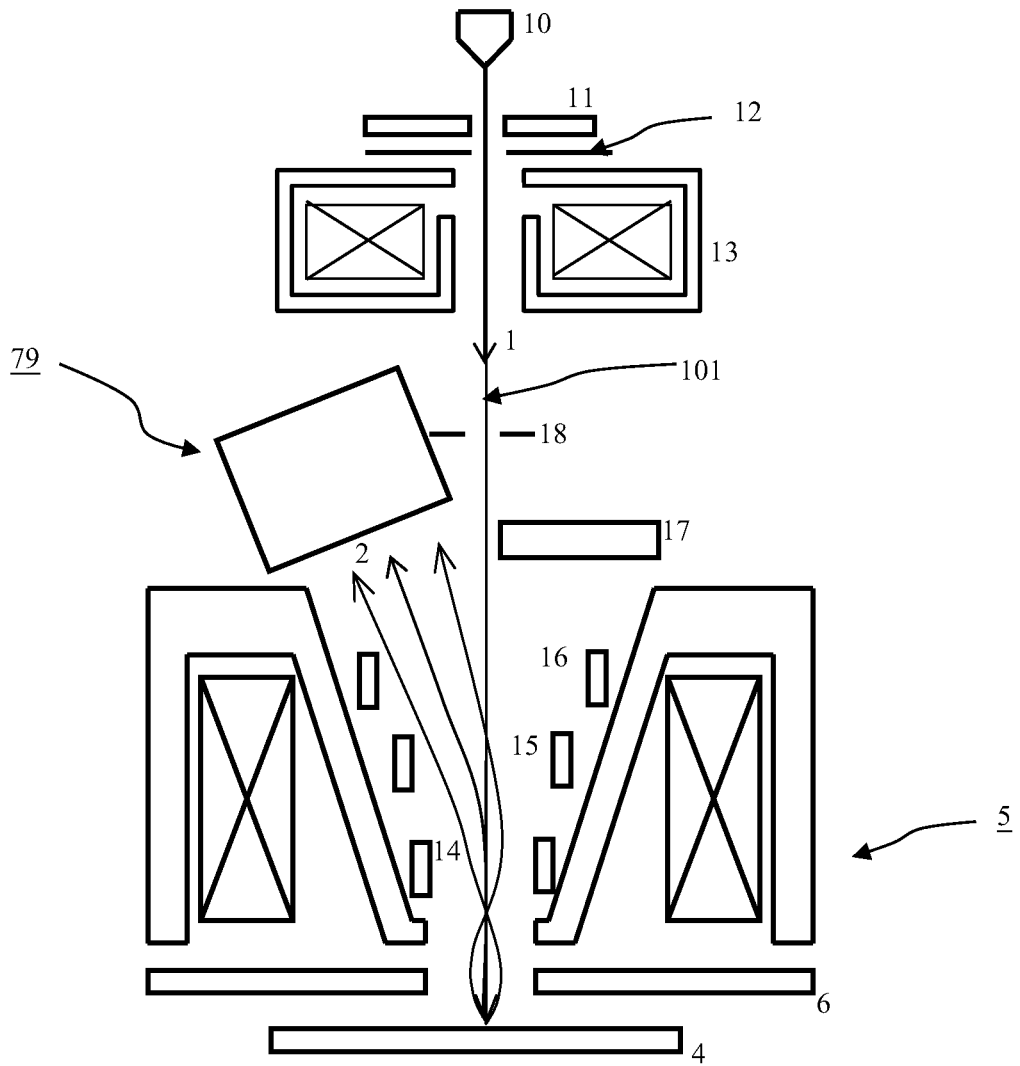
FIG. 12 is a schematic illustration of a LVSEM with an energy-discrimination detection device and a conventional detection device in accordance with one embodiment of the present invention.

FIG. 12 demonstrates a conventional LVSEM using one of the foregoing energy-discrimination detection devices. In FIG. 12, the primary electrons are emitted from the electron source 10 along the optical axis 101 of the LVSEM and accelerated by the anode 11 so as to have kinetic energies much higher than the landing energies of the primary electrons on the upper surface of the specimen. The gun aperture 12 cuts off the primary electrons with polar angles larger than a specific value and thereby limiting the current of the primary electron beam 1 formed by the primary electrons. Then PE beam 1 is focused by the condenser lens 13 and passes the beam-limit aperture 18. The size of beam-limit aperture 18 and the focusing power of the condenser lens 13 are selected to get the desired current value of the PE beam 1 thereafter. The magnetic objective lens 5, the retarding electrode 6 and the specimen 4 forms an electromagnetic-compound retarding objective lens which focuses the PE beam 1 while decelerating the primary electrons thereof so as to get a focused probe with the desired low landing energy on the upper surface of the specimen 4. The two deflectors 14 and 16 together dynamically deflect the PE beam 1 so as to make the focused probe scan the specimen surface with small off-axis aberrations. The secondary emission beam 2 released by the PE beam 1 from the specimen surface 4 can be deflected by the Wien filter 15 to be incident to the conventional detector 17 or the energy-discrimination detection device 79 with respect to the requirements of applications. The energy-discrimination detection device 79 can have one embodiment same as or similar to those shown in FIGS. 11A~FIG. 11C, and can further comprises one or more of the foregoing detection means so as to have multiple functions as mentioned above.

In summary, the present invention provides two methods for improving performance of an energy-discrimination detection device with an energy filter of reflective type for a charged particle beam. The first method employs a beam-adjusting lens on an entrance side of a potential barrier of the energy filter to make the charged particle beam become a substantially parallel beam to be incident onto the potential barrier, and consequently improves the energy-discrimination power. The second method places an electron-multiplication plate or a MCP in front of one detector to directly increase the number of signal electrons landing thereon, therefore enhancing the image signal without noise raise. Using such an improved energy-discrimination detection device in a LVSEM, can not only obviously improve image contrast, but also provide variant images, such as SE image, BSE image and dark-field image, of interested features on a specimen surface for multiple application purposes.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An energy-discrimination detection device for detecting an electron beam, comprising:
    an energy filter, comprising:
        a filtering grid electrode being set at a first potential to form a potential barrier; and,
        a beam-adjusting lens below said filtering grid electrode and being excited to make said electron beam become a substantially parallel beam to be incident onto said potential barrier,
            wherein a first plurality of electrons of said electron beam, which has initial kinetic energies higher than a specific value and thus is able to cross said potential barrier, passes through said filtering grid electrode and forms an exiting electron beam, while a second plurality of electrons of said electron beam, which has initial kinetic energies not higher enough to be able to cross said potential barrier, is reflected back from said filtering grid electrode and forms a reflection electron beam;
    an electron-multiplication plate above said energy filter and comprising an electron-multiplication surface, wherein said electron-multiplication surface is made of electric conductor material which can generate a secondary emission with a total yield ($\sigma$) higher than 1; and
    a first detector above said energy filter and beside said electron-multiplication plate,
        wherein said electron-multiplication surface is placed and set at a second potential to attract said first plurality of electrons to land thereon and generate said secondary emission,
        wherein said first detector is placed and set at a third potential to receive electrons of a secondary emission beam of said secondary emission,
        wherein an optical axis of said beam-limiting lens is both an optical axis of said energy filter and an optical axis of said energy-discrimination detection device.

2. The energy-discrimination detection device according to claim 1, wherein said filtering grid electrode is perpendicular to and aligned with said optical axis of said beam-adjusting lens.

3. The energy-discrimination detection device according to claim 2, further comprising a shielding box covering said energy filter, said electron-multiplication plate and said first detector, wherein said shielding box is made of electric conductor material and has an entrance plate which is below said energy filter, perpendicular to said optical axis and has an entrance grid for said electron beam passing through.

4. The energy-discrimination detection device according to claim 3, wherein said shielding box is set at a potential of a neighborhood where said energy-discrimination detection device is placed.

5. The energy-discrimination detection device according to claim 4, further comprising a second detector below said entrance grid, wherein said second detector has an opening for a central part of said electron beam passing through and fully or partially detects other part thereof.

6. The energy-discrimination detection device according to claim 4, further comprising a third detector being placed and excited to detect said reflection electron beam.

7. The energy-discrimination detection device according to claim 1, wherein said second potential is adjusted to maximize said total yield so as to enhance an image signal of said first detector.

8. The energy-discrimination detection device according to claim 1, further comprising a shielding grid electrode placed in front of said first detector and set at a fourth potential, wherein said fourth potential is lower enough than said third potential so that said shielding grid electrode is not able to directly attract said first plurality of electrons, but higher enough than said second potential so as to attract electrons of said secondary emission beam.

9. An energy-discrimination detection device for detecting an electron beam, comprising:
    an energy filter, comprising:
        a filtering grid electrode being set at a first potential to form a potential barrier; and,
        a beam-adjusting lens below said filtering grid electrode and being excited to make said electron beam become a substantially parallel beam to be incident onto said potential barrier,
            wherein a first plurality of electrons of said electron beam, which has initial kinetic energies higher than a specific value and thus is able to cross said potential barrier, passes through said filtering grid electrode and forms an exiting electron beam, while a second plurality of electrons of said electron beam, which has initial kinetic energies not higher enough to be able to cross said potential barrier, is reflected back from said filtering grid electrode and forms a reflection electron beam;
    a microchannel plate (MCP) above said energy filter; and
    a first detector above said microchannel plate,
        wherein an input surface and channel axes of said microchannel plate are set to receive said first plurality of electrons and generate sequential secondary emissions inside a channel thereof,
        wherein said first detector is set to receive electrons of a secondary emission beam exiting from an outer surface of said microchannel plate,
        wherein an optical axis of said beam-limiting lens is both an optical axis of said energy filter and an optical axis of said energy-discrimination detection device.

10. The energy-discrimination detection device according to claim 9, wherein said filtering grid electrode is perpendicular to and aligned with said optical axis of said beam-adjusting lens.

11. The energy-discrimination detection device according to claim 10, further comprising a shielding box covering said energy filter, said microchannel plate and said first detector, wherein said shielding box is made of electric conductor material and has an entrance plate which is below said energy filter, perpendicular to said optical axis and has an entrance grid for said electron beam passing through.

12. The energy-discrimination detection device according to claim 11, wherein said shielding box is set at a potential of a neighborhood where said energy-discrimination detection device is placed.

13. The energy-discrimination detection device according to claim 12, further comprising a second detector below said entrance grid, wherein said second detector has an opening for a central part of said electron beam passing through and fully or partially detects other part thereof.

14. The energy-discrimination detection device according to claim 12, further comprising a third detector being placed and excited to detect said reflection electron beam.

15. An electron beam apparatus for observing a surface of a specimen, comprising:
an electron source being excited to emit primary electrons along an optical axis of said electron beam apparatus;
an accelerating electrode below said electron source and having an opening aligned with said optical axis for said primary electrons passing through, which is excited to accelerate said primary electrons to have desired first energies;
a condenser lens below said accelerating electrode and aligned with said optical axis;
a beam-limiting aperture plate below said condenser lens and having a plurality of apertures with different radial sizes, wherein one of said plurality of apertures is selected as a beam-limit aperture and thus aligned with said optical axis,
wherein said condenser lens is excited to make a part of said primary electrons pass through said beam-limit aperture so as to form a primary electron beam with a desired current value;
a magnetic objective lens below said beam-limiting aperture plate and aligned with said optical axis;
a retarding electrode below said magnetic objective lens and having an opening aligned with said optical axis for said primary electron beam passing through;
a specimen stage below said retarding electrode and supporting said specimen, wherein said surface is opposite to said retarding electrode;
a deflection unit between said beam-limiting aperture plate and said retarding electrode,
wherein said retarding electrode and said specimen are excited to decelerate said primary electrons of said primary electron beam to land on said surface with desired second energies much lower than said first energies,
wherein said magnetic objective lens is excited to focus said primary electron beam to form a focused probe on said surface and said focused probe releases a first secondary emission beam therefrom,
wherein said deflection unit deflects said primary electron beam and thus makes said focused probe scan said surface;
an energy-discrimination detection device above said deflection unit and away from said optical axis, which comprises an energy filter, an electron-multiplication means and a first detector,
wherein said energy filter comprises a filtering grid electrode and a beam-adjusting lens, said filtering grid electrode functions as a potential barrier, said beam-adjusting lens is below said filtering grid electrode and functions as a means for adjusting an incident electron beam of said energy filter to become a substantially parallel beam to be incident onto said potential barrier, and consequently a first plurality of electrons of said incident electron beam, which has initial kinetic energies higher than a specific value and thus is able to cross said potential barrier, passes through said filtering grid electrode and forms an exiting electron beam, while a second plurality of electrons of said incident electron beam, which has initial kinetic energies not higher enough to be able to cross said potential barrier, is reflected back from said filtering grid electrode and forms a reflection electron beam,
wherein said electron-multiplication means is above said energy-filter and set to receive said exiting electron beam which generates a second secondary emission therein, and output a second secondary emission beam with a total yield ($\sigma$) higher than 1,
wherein said first detector is above said energy-filter and set to detect said second secondary emission beam; and
a Wien filter between said specimen and said energy-discrimination detection device.

16. The electron beam apparatus according to claim 15, wherein said Wien filter is excited to deflect said first secondary emission beam to be incident onto said energy-discrimination detection device while not deflecting said primary electron beam, and therefore said first secondary emission beam is said incident electron beam of said energy filter.

17. The electron beam apparatus according to claim 15, further comprising a second detector above said deflection unit and away from said optical axis, wherein said Wien filter is excited to deflect said first secondary emission beam to be detected by said second detector while not deflecting said primary electron beam.

18. The electron beam apparatus according to claim 15, wherein said electron-multiplication means is an electron-multiplication plate with an electron-multiplication surface aligned to receive said exiting electron beam and generate said second secondary emission beam.

19. The electron beam apparatus according to claim 18, further comprising a shielding grid electrode placed in front of said first detector and functioning as a means for making more of said first plurality of electrons hitting said electron-multiplication surface and attracting more of electrons of said second secondary emission beam towards said first detector.

20. The electron beam apparatus according to claim 15, wherein said electron-multiplication means is a microchannel plate, an input surface and channel axes of said microchannel plate are set to receive said exiting electron beam, generate a series of said second secondary emissions in a channel thereof and output said second secondary emission beam from an outer surface of said microchannel plate.

* * * * *